(12) United States Patent
Chi et al.

(10) Patent No.: US 11,854,784 B2
(45) Date of Patent: Dec. 26, 2023

(54) CHIP SCALE PACKAGE STRUCTURE AND METHOD OF FORMING THE SAME

(71) Applicant: MediaTek Inc., Hsin-Chu (TW)

(72) Inventors: Yen-Yao Chi, Hsin-Chu (TW); Nai-Wei Liu, Hsin-Chu (TW); Ta-Jen Yu, Hsin-Chu (TW); Tzu-Hung Lin, Hsin-Chu (TW); Wen-Sung Hsu, Hsin-Chu (TW); Shih-Chin Lin, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/989,498

(22) Filed: Nov. 17, 2022

(65) Prior Publication Data

US 2023/0073399 A1 Mar. 9, 2023

Related U.S. Application Data

(63) Continuation of application No. 16/903,458, filed on Jun. 17, 2020, now abandoned, which is a
(Continued)

(51) Int. Cl.
*H01L 23/48* (2006.01)
*H01L 23/31* (2006.01)
(Continued)

(52) U.S. Cl.
CPC ........ *H01L 23/3114* (2013.01); *H01L 21/561* (2013.01); *H01L 21/568* (2013.01);
(Continued)

(58) Field of Classification Search
CPC ............. H01L 23/3114; H01L 23/3121; H01L 23/3135; H01L 23/3185; H01L 23/3192; H01L 2224/2373; H01L 2224/13024
(Continued)

(56) References Cited

U.S. PATENT DOCUMENTS 5,920,770 A 7/1999 Yasunaga et al.
5,990,546 A 11/1999 Igarashi et al.
(Continued)

FOREIGN PATENT DOCUMENTS

CN 106560918 A 4/2017
DE 102018124848 A1 6/2019
(Continued)

OTHER PUBLICATIONS

Chinese Office Action dated Dec. 18, 2020 for Chinese Application No. 201910849994.7.
Taiwanese Office Action dated May 29, 2020 for Taiwanese Application No. 108131846.
Taiwanese Office Action dated Apr. 27, 2021 for Taiwanese Application No. 109126058.
(Continued)

*Primary Examiner* — Nitin Parekh
(74) *Attorney, Agent, or Firm* — Wolf, Greenfield & Sacks, P.C.

(57) ABSTRACT

A semiconductor package structure includes a semiconductor die, a redistribution layer (RDL) structure, a protective insulating layer, and a conductive structure. The semiconductor die has a first surface, a second surface opposite the first surface, and a third surface adjoined between the first surface and the second surface. The RDL structure is on the first surface of the semiconductor die and is electrically coupled to the semiconductor die. The protective insulating layer covers the RDL structure, the second surface and the third surface of the semiconductor die. The conductive structure passes through the protective insulating layer and is electrically coupled to the RDL structure.

12 Claims, 28 Drawing Sheets

Related U.S. Application Data continuation-in-part of application No. 16/430,076, filed on Jun. 3, 2019, now Pat. No. 11,450,606.

(60) Provisional application No. 62/881,441, filed on Aug. 1, 2019, provisional application No. 62/881,434, filed on Aug. 1, 2019, provisional application No. 62/731,128, filed on Sep. 14, 2018.

(51) Int. Cl.
*H01L 23/00* (2006.01)
*H01L 21/56* (2006.01)
*H01L 23/29* (2006.01)

(52) U.S. Cl.
CPC ........ *H01L 23/293* (2013.01); *H01L 23/3135* (2013.01); *H01L 23/3171* (2013.01); *H01L 23/3185* (2013.01); *H01L 23/3192* (2013.01); *H01L 24/05* (2013.01); *H01L 24/13* (2013.01); *H01L 2224/024* (2013.01); *H01L 2224/02331* (2013.01); *H01L 2224/02377* (2013.01); *H01L 2224/02379* (2013.01); *H01L 2224/02381* (2013.01); *H01L 2224/0401* (2013.01); *H01L 2224/05569* (2013.01); *H01L 2224/12105* (2013.01); *H01L 2224/13024* (2013.01)

(58) Field of Classification Search
USPC .......................................................... 257/737
See application file for complete search history.

(56) References Cited

U.S. PATENT DOCUMENTS

| | | | |
|---|---|---|---|
| 6,140,707 A | 10/2000 | Plepys et al. | |
| 6,340,841 B2 | 1/2002 | Iijima et al. | |
| 6,528,894 B1 | 3/2003 | Akram et al. | |
| 6,590,291 B2 | 7/2003 | Akagawa | |
| 6,657,282 B2 | 12/2003 | Fukasawa et al. | |
| 6,894,386 B2 | 5/2005 | Poo et al. | |
| 6,902,950 B2 | 6/2005 | Ma et al. | |
| 7,705,457 B2 | 4/2010 | Han | |
| 7,932,615 B2 | 4/2011 | Rinne | |
| 8,203,145 B2 | 6/2012 | Kuan et al. | |
| 8,203,217 B2 | 6/2012 | Suh | |
| 8,742,589 B2 | 6/2014 | Kawabata et al. | |
| 8,884,433 B2 | 11/2014 | Lin et al. | |
| 9,040,316 B1 | 5/2015 | Scanlan et al. | |
| 9,598,240 B2* | 3/2017 | Mast | B65G 15/12 |
| 9,837,379 B2 | 12/2017 | Chen et al. | |
| 9,978,658 B2 | 5/2018 | Suthiwongsunthorn et al. | |
| 10,068,867 B2 | 9/2018 | Chiu et al. | |
| 10,366,953 B2 | 7/2019 | Chen et al. | |
| 11,450,606 B2 | 9/2022 | Chi et al. | |
| 2002/0180026 A1* | 12/2002 | Liu | G01R 31/2884 257/773 |
| 2004/0091482 A9 | 5/2004 | Watkins et al. | |
| 2005/0148160 A1 | 7/2005 | Farnworth et al. | |
| 2006/0093580 A1* | 5/2006 | Iwashima | C12N 5/0637 424/93.1 |
| 2007/0290376 A1 | 12/2007 | Zhao et al. | |
| 2010/0062600 A1 | 3/2010 | Utsuki | |
| 2011/0266670 A1 | 11/2011 | England et al. | |
| 2012/0119378 A1 | 5/2012 | Ng et al. | |
| 2012/0180026 A1* | 7/2012 | Dhanakshirur | G06F 8/20 717/121 |
| 2013/0037935 A1 | 2/2013 | Xue et al. | |
| 2013/0280826 A1* | 10/2013 | Scanlan | H01L 24/03 438/15 |
| 2014/0091455 A1 | 4/2014 | Strothmann et al. | |
| 2014/0091482 A1 | 4/2014 | Lin et al. | |
| 2014/0264839 A1 | 9/2014 | Tsai et al. | |
| 2015/0187710 A1 | 7/2015 | Scanlan et al. | |
| 2015/0228552 A1* | 8/2015 | Lin | H01L 21/56 438/114 |
| 2016/0013148 A1 | 1/2016 | Lin et al. | |
| 2016/0086825 A1 | 3/2016 | Scanlan et al. | |
| 2016/0284654 A1 | 9/2016 | Yu et al. | |
| 2017/0033009 A1 | 2/2017 | Scanlan et al. | |
| 2017/0098628 A1 | 4/2017 | Liu et al. | |
| 2018/0219000 A1 | 8/2018 | Chang et al. | |
| 2020/0091070 A1 | 3/2020 | Chi et al. | |
| 2020/0312732 A1 | 10/2020 | Chi et al. | |
| 2021/0217717 A1* | 7/2021 | Jung | H01L 23/00 |
| 2022/0392839 A1 | 12/2022 | Chi et al. | |

FOREIGN PATENT DOCUMENTS

| | | |
|---|---|---|
| EP | 3 157 056 A2 | 4/2017 |
| TW | 201243966 A1 | 11/2012 |
| TW | 201436163 A | 9/2014 |
| TW | 201701430 A | 1/2017 |
| TW | I595614 B | 8/2017 |

OTHER PUBLICATIONS

Extended European Search Report dated Aug. 19, 2019 in connection with European Application No. 19184181.6.
Partial European Search Report for European Application No. EP 20183881.0 dated Jan. 13, 2021.
Extended European Search Report dated Dec. 2, 2022 in connection with European Application No. 20183881.0.
U.S. Appl. No. 16/430,076, filed Jun. 3, 2019, Chi et al.
U.S. Appl. No. 16/903,458, filed Jun. 17, 2020, Chi et al.
U.S. Appl. No. 17/886,704, filed Aug. 12, 2022, Chi et al.
EP 19184181.6, Aug. 19, 2019, Extended European Search Report.
EP 20183881.0, Jan. 13, 2021, Partial European Search Report.

* cited by examiner

CHIP SCALE PACKAGE STRUCTURE AND METHOD OF FORMING THE SAME

CROSS REFERENCE TO RELATED APPLICATIONS

This application is a Continuation of U.S. application Ser. No. 16/903,458, filed Jun. 17, 2020, which is a Continuation-In-Part of application Ser. No. 16/430,076 filed on Jun. 3, 2019, which claims the benefit of U.S. Provisional Application No. 62/731,128 filed on Sep. 14, 2018, the entirety of which is incorporated by reference herein. This application also claims the benefit of U.S. Provisional Application No. 62/881,434 filed on Aug. 1, 2019, the entirety of which is incorporated by reference herein. This application also claims the benefit of U.S. Provisional Application No. 62/881,441 filed on Aug. 1, 2019, the entirety of which is incorporated by reference herein.

BACKGROUND OF THE INVENTION

Field of the Invention

The present invention relates to semiconductor package technology, and in particular to a wafer level chip scale package (WLCSP) structure.

Description of the Related Art

Integrated circuit (IC) devices are fabricated in a semiconductor wafer and divided into individual chips. Afterwards, those chips are assembled in package form to be used in electronic products. The package provides a structure to support the chip and protect the chip from the environment. The package also provides electrical connections to and from the chip.

In recent years, as electronic products have become increasingly multifunctional and have been scaled down in size, there is a desire for manufacturers of semiconductor devices to make more devices formed on a single semiconductor wafer, so that the electronic products that include these devices can be made more compact. This results in many new challenges to the structural and electrical design of the package.

Accordingly, a chip scale package (CSP) technology has been developed to satisfy the industry's demands (e.g., the smaller chip size and form factor). Moreover, a wafer level package (WLP) technology has also been introduced for the cost-effective fabrication of packages. Such a technology is referred to as wafer-level chip scale package (WLCSP).

However, in the use of the WLCSP process, the surface of each chip in the respective package is exposed to the environment after the packages are separated from the package wafer. As a result, damage to the chip may occur, thereby reducing the reliability of the semiconductor packages. Thus, a novel semiconductor package structure and a fabrication method thereof are desirable.

BRIEF SUMMARY OF THE INVENTION

Semiconductor package structures are provided. An exemplary embodiment of a semiconductor package structure includes a semiconductor die, a redistribution layer (RDL) structure, a protective insulating layer, and a conductive structure. The semiconductor die has a first surface, a second surface opposite the first surface, and a third surface adjoined between the first surface and the second surface. The RDL structure is on the first surface of the semiconductor die and is electrically coupled to the semiconductor die. The protective insulating layer covers the RDL structure, the second surface and the third surface of the semiconductor die. The conductive structure passes through the protective insulating layer and is electrically coupled to the RDL structure.

Another exemplary embodiment of a semiconductor package structure includes a semiconductor die, a first protective insulating layer, a first redistribution layer (RDL) structure, a first passivation layer, and a plurality of conductive structures. The semiconductor die has a first surface, a second surface opposite the first surface, and a third surface adjoined between the first surface and the second surface. The first protective insulating layer covers the first surface and the third surface of the semiconductor die. The first RDL structure is over the first surface of the semiconductor die and is electrically coupled to the semiconductor die and extends to directly above the first protective insulating layer. The first passivation layer covers the first protective insulating layer and the first RDL structure. The plurality of conductive structures passes through the first passivation layer and is electrically coupled to the first RDL structure.

Yet another exemplary embodiment of a semiconductor package structure includes a semiconductor die, a first redistribution layer (RDL) structure, a first protective insulating layer, a first passivation layer, a second RDL structure, a second passivation layer, and a plurality of conductive structures. The semiconductor die has a first surface, a second surface opposite the first surface, and a third surface adjoined between the first surface and the second surface. The first RDL structure is on the first surface of the semiconductor die and is electrically coupled to the semiconductor die. The first protective insulating layer covers the first surface and the third surface of the semiconductor die and surrounds the first RDL structure. The first passivation layer covers the first protective insulating layer and the first RDL structure. The second RDL structure is electrically coupled to the semiconductor die through the first RDL structure, wherein the second RDL structure extends from the first RDL structure to above the first protective insulating layer. The second passivation layer covers the second RDL structure. The plurality of conductive structures passes through the second passivation layer and is electrically coupled to the second RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
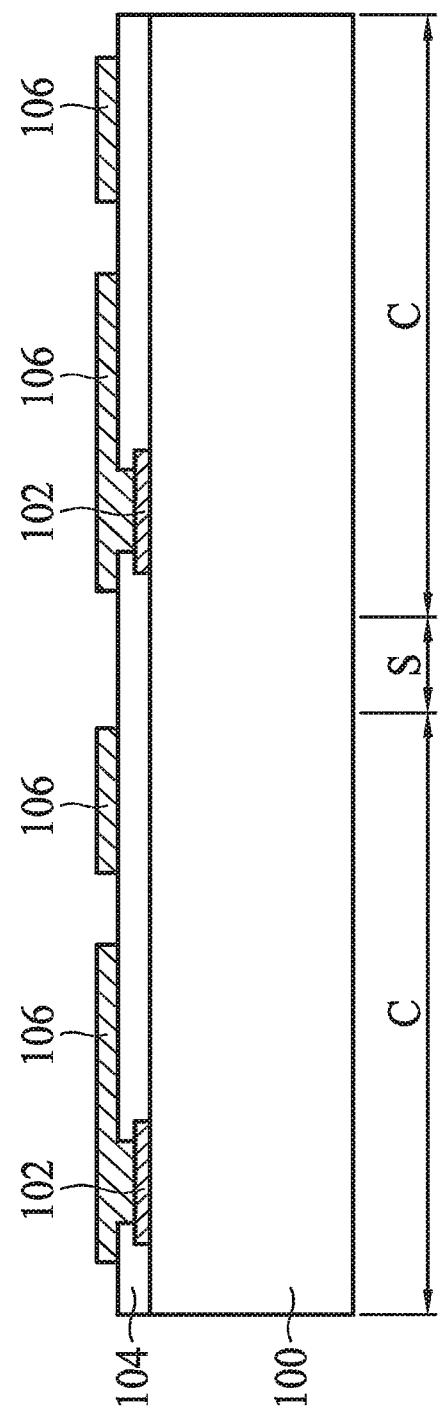
FIGS. 1A to 1F are cross-sectional views of an exemplary method of forming a semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1A to 1F are cross-sectional views of an exemplary method of forming a semiconductor package structure in accordance with some embodiments of the disclosure. As shown in FIG. 1A, a substrate 100 is provided. In some embodiments, the substrate 100 may include a plurality of chip regions and a scribe line region that surrounds the plurality of chip regions and separates the adjacent chip regions from each other. To simplify the diagram, only two complete and adjacent chip regions C and a scribe line region S separating these chip regions C are depicted herein. The substrate 100 may be a silicon wafer so as to facilitate the wafer-level packaging process. For example, the substrate 100 may be a silicon substrate or another semiconductor substrate.

In some embodiments, the chip regions C of the substrate 100 include integrated circuits (not shown) therein. In some embodiments, an insulating layer 104 is formed on the substrate 100. The insulating layer 104 may serve as an inter-dielectric (ILD) layer, an inter-metal dielectric (IMD) layer, a passivation layer or a combination thereof. To simplify the diagram, only a flat layer is depicted herein. In some embodiments, the insulating layer 104 is made of an inorganic material, such as silicon oxide ($SiO_x$), silicon nitride ($SiN_x$), silicon oxynitride (SiON), or a combination thereof, or another suitable insulating material.

Moreover, the insulating layer 104 includes one or more conductive pads 102 therein. The conductive pads 102 correspond to the chip regions C of the substrate 100 and are adjacent to the upper surface of the substrate 100. The conductive pad 102 may be formed of metal, such as copper, aluminum, or another suitable metal material. To simplify the diagram, only one conductive pad 102 formed on the substrate 100 in each chip region C and exposed from the insulating layer 104 is depicted herein as an example. In some embodiments, the ICs in the chip region C is electrically connected to the corresponding conductive pad 102. The aforementioned structure define a number of semiconductor dies/chips after the chip regions C are separated from each other by dicing the scribe line region S of the substrate 100.

In some embodiments, a conductive layer (not shown), such as a metal layer, is formed on the insulating layer 104 and passing through the insulating layer 104 to electrically couple to the exposed pads 102 in the chip regions C. Afterwards, the conductive layer is patterned to form a redistribution layer (RDL) structure 106 in each of the chip regions C, so that the RDL structure 106 is electrically coupled to the subsequent formed semiconductor die, as shown in FIG. 1A.

Figure 1B:
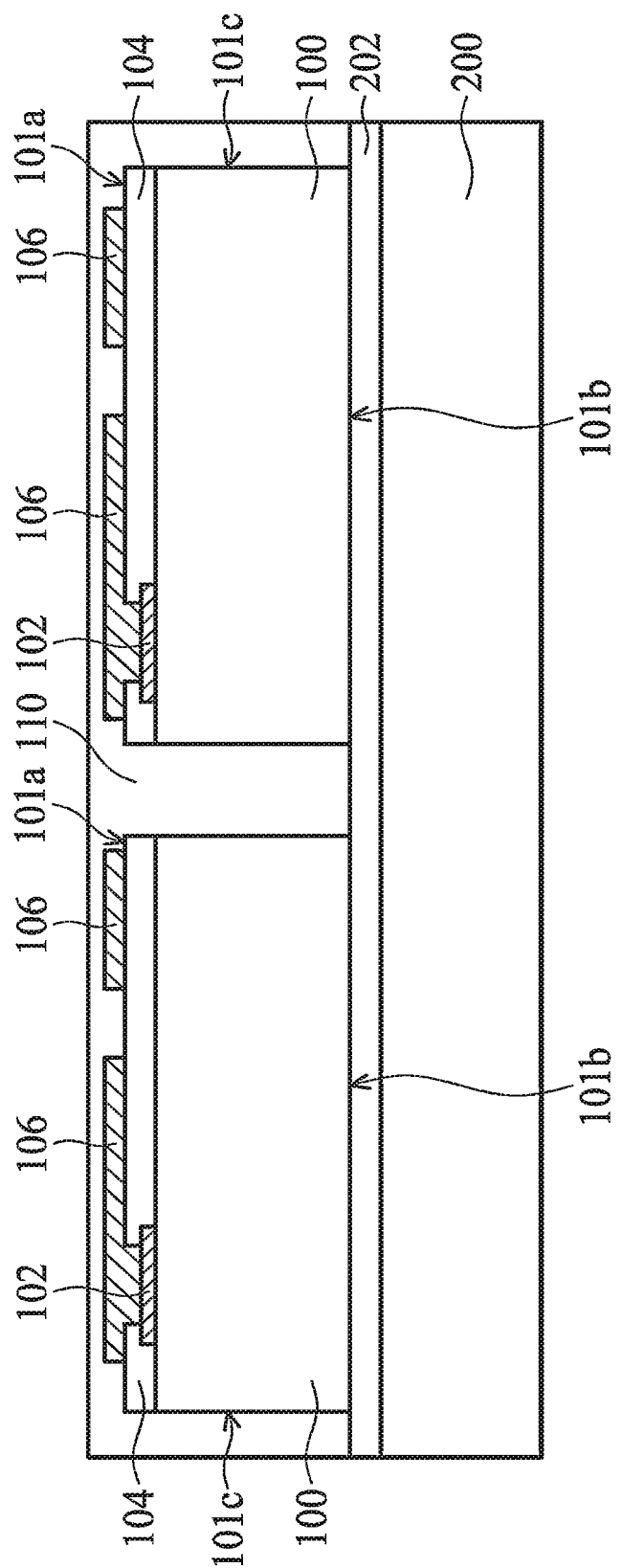

As shown in FIG. 1B, in some embodiments, the chip regions C are separated from each other by dicing the scribe line region S of the substrate 100 to form semiconductor dies with the RDL structures 106 thereon. The formed semiconductor die may be a system on chip (SOC) integrated circuit die. The SOC integrated circuit die, for example, may include a logic die including a central processing unit (CPU), a graphics processing unit (GPU), a dynamic random access memory (DRAM) controller or any combination thereof. Each of semiconductor dies includes a substrate 100, at least one conductive pad 102 formed on the substrate 100, and an insulating layer 104 formed over the substrate 100 and having an opening to expose the conductive pad 102. Moreover, the semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

As shown in FIG. 1B, in some embodiments, a carrier substrate 200 with an adhesive layer 202 formed thereon is provided. The carrier substrate 200 may be made of silicon, glass, ceramic or the like, and may have a shape that is the same or similar to the semiconductor wafer, and therefore the carrier substrate 200 is sometimes referred to as a carrier wafer. The adhesive layer 202 may be made of a light-to-heat conversion (LTHC) material or another suitable material. Afterwards, in some embodiments, the second surface 101b of each semiconductor die that has an RDL structure 106 formed on the first surface 101a of the semiconductor die is mounted onto the carrier substrate 200 via the adhesive layer 202 using a pick-and-place process.

Next, in some embodiments, a protective insulating layer 110 is formed to cover the first surface 101a and the third surface 101c of the semiconductor dies and to surround the RDL structures 106, so that each of the formed semiconductor dies with an RDL structure 106 thereon is encapsulated by the protective insulating layer 110. In some embodiments, the protective insulating layer 110 protects the semiconductor dies from the environment, thereby preventing the semiconductor die in the subsequently formed semiconductor package structure from damage due to, for example, the stress, the chemicals and/or the moisture.

In some embodiments, the protective insulating layer 110 is made of an epoxy molding compound (EMC), an Ajinomoto™ Build-up Film (ABF), or an acrylic-based material. In some embodiments, the protective insulating layer 110 is made of an epoxy molding compound (EMC) and formed by a molding process. For example, the protective insulating layer 110 (such as in an epoxy or resin) may be applied while substantially liquid, and then may be cured through a chemical reaction. The protective insulating layer 110 may be an ultraviolet (UV) or thermally cured polymer applied as a gel or malleable solid capable of being formed around the semiconductor dies, and then may be cured through a UV or thermal curing process. The protective insulating layer 110 may be cured with a mold (not shown).

Figure 1C:
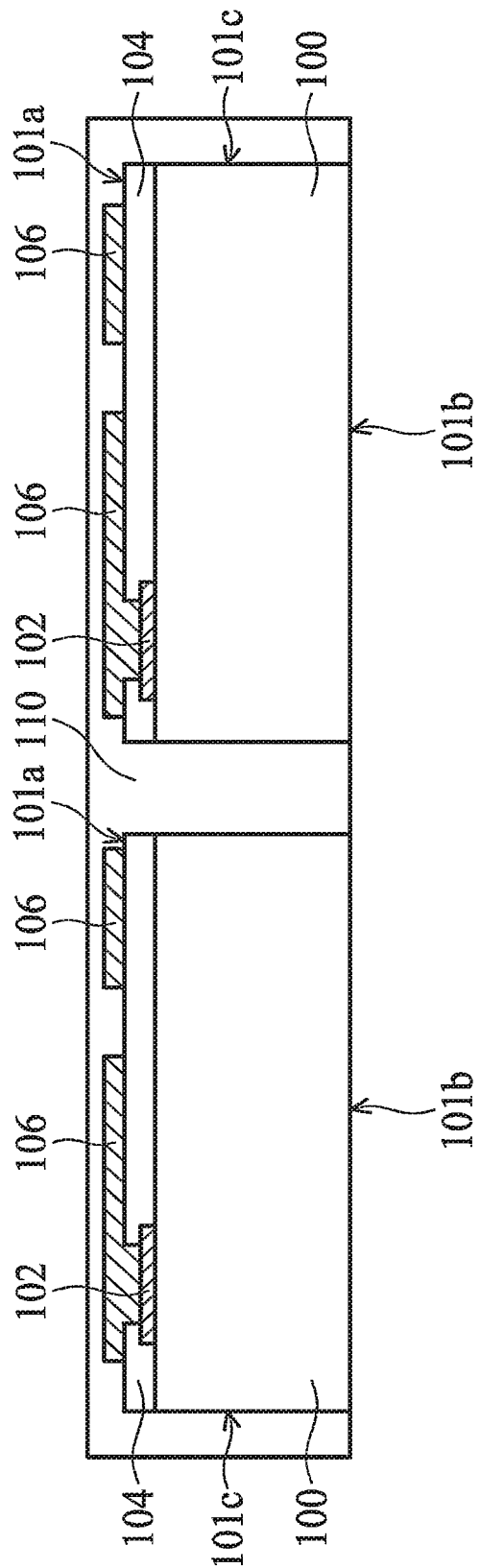

After the protective insulating layer 110 is formed, the semiconductor dies with RDL structures 106 encapsulated by the protective insulating layer 110 are de-bonded from the carrier substrate 200, as shown in FIG. 1C. In some embodiments, a de-bonding process is performed by exposing the adhesive layer 202 (shown in FIG. 1B) using a laser or UV light when the adhesive layer 202 is made of an LTHC material. The LTHC material may be decomposed due to generated heat from the laser or UV light, and hence the carrier substrate 200 is removed from the structure including the semiconductor dies, the RDL structures 106, and the protective insulating layer 110. As a result, the second surface 101b of each semiconductor die is exposed from the protective insulating layer 110. The resulting structure is shown in FIG. 1C.

Figure 1D:
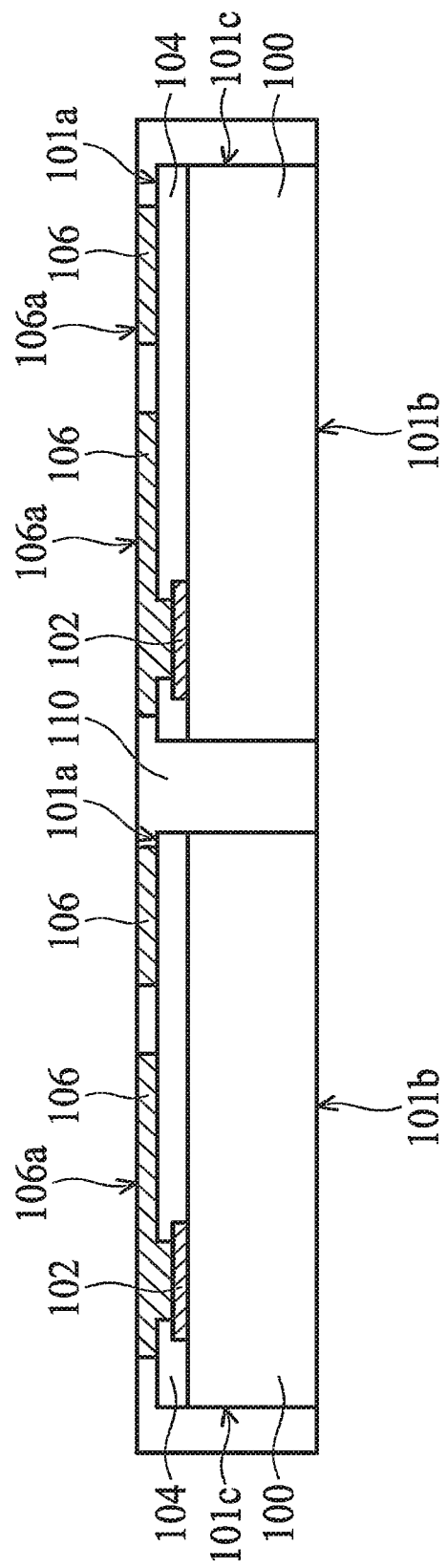

In some embodiments, after the carrier substrate 200 is removed by the de-bonding process, a grinding process is performed on the top surface of the protective insulating layer 110 until the RDL structures 106 are exposed from the protective insulating layer 110, as shown in FIG. 1D. For example, the top surface of the protective insulating layer 110 may be grinded by a chemical mechanical polishing (CMP) process or another suitable grinding process.

Figure 1E:
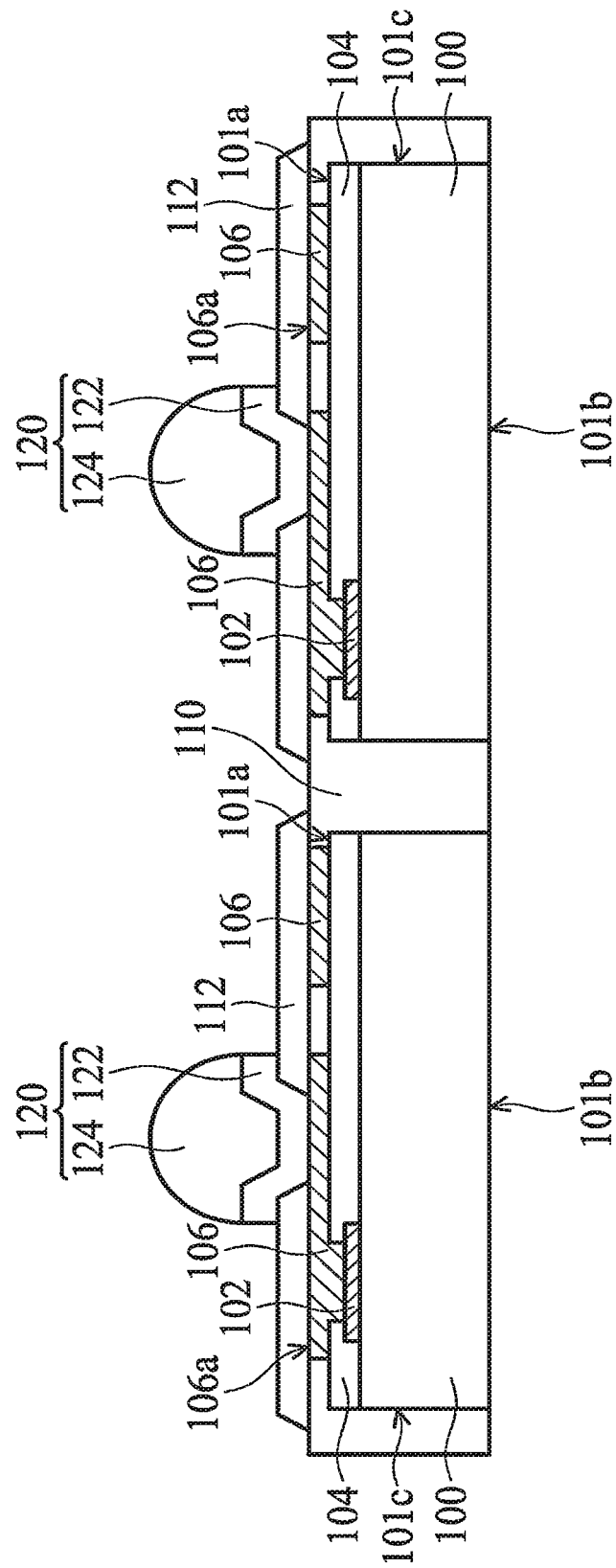

Afterwards, the protective insulating layer 110 and the RDL structures 106 are covered with a passivation layer 112, as shown in FIG. 1E. In some embodiments, the passivation layer 112 is formed on the protective insulating layer 110 and the RDL structures 106 by a coating process or another suitable deposition process. Afterwards, the passivation layer 112 is patterned by lithography or a combination of lithograph and etching to form openings that expose the RDL structures 106. In some embodiments, the passivation layer 112 is made of a material that is different from the material of the protective insulating layer 110. In some embodiments, the passivation layer 112 is made of polyimide or polybenzoxazole (PBO).

In some embodiments, during patterning the passivation layer 112, the passivation layer 112 is also divided into several portions, so that each of the semiconductor dies is covered by a respective portion of passivation layer 112. In some other embodiments, the passivation layer 112 is divided into several portions by the subsequent dicing process.

After openings are formed in the passivation layer 112, conductive structures 120 respectively pass through the passivation layer 112 via those openings formed in the passivation layer 112, as shown in FIG. 1E. In some embodiments, the conductive structures 120 fill into the openings formed in the passivation layer 112, so that each of the conductive structures 120 is electrically coupled to the respective exposed RDL structure 106 under the opening in the passivation layer 112.

In some embodiments, the conductive structure 120 includes an optional under-bump metallurgy (UBM) layer 122 and a solder bump 124 on the UBM layer 122. In some other embodiments, the conductive structure 120 includes a conductive bump structure such as a copper bump, a conductive pillar structure, a conductive wire structure, or a conductive paste structure.

Figure 1F:
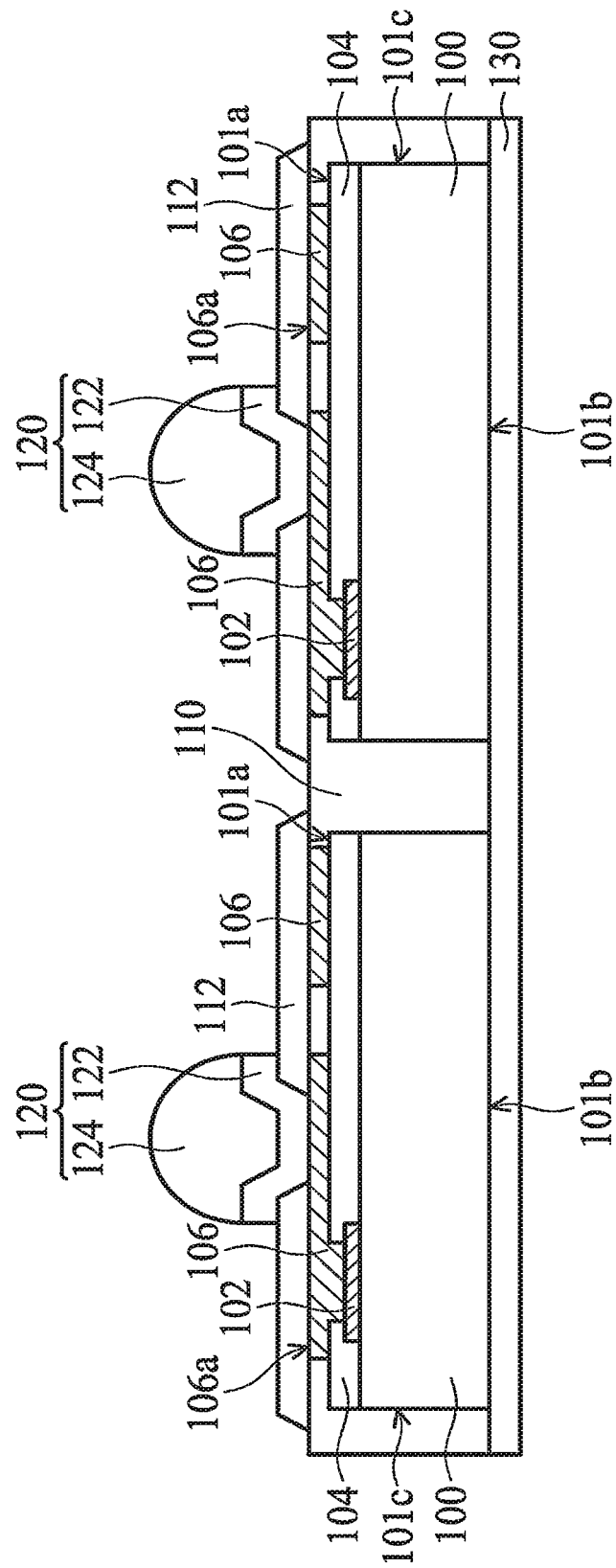

After the conductive structures 120 are formed, an optional protective insulating layer 130 is formed to cover the exposed second surfaces 101b of the semiconductor dies, as shown in FIG. 1F. The protective insulating layer 130 is sometimes referred to as a die backside film (DBF) that is made of a thermoset material, such as an epoxy resin material. In some other embodiments, the protective insulating layer 130 is made of a material that is the same as the material of the protective insulating layer 110. For example, the protective insulating layer 130 is made of an epoxy molding compound (EMC), an Ajinomoto™ Build-up Film (ABF), or an acrylic-based material.

In some embodiments, after the protective insulating layer 130 is formed, a singulation is carried out to saw through the formed structure shown in FIG. 1F. For example, a dicing process may be performed on the formed structure shown in FIG. 1F. As a result, multiple separate semiconductor package structures are formed.

Figure 2A:
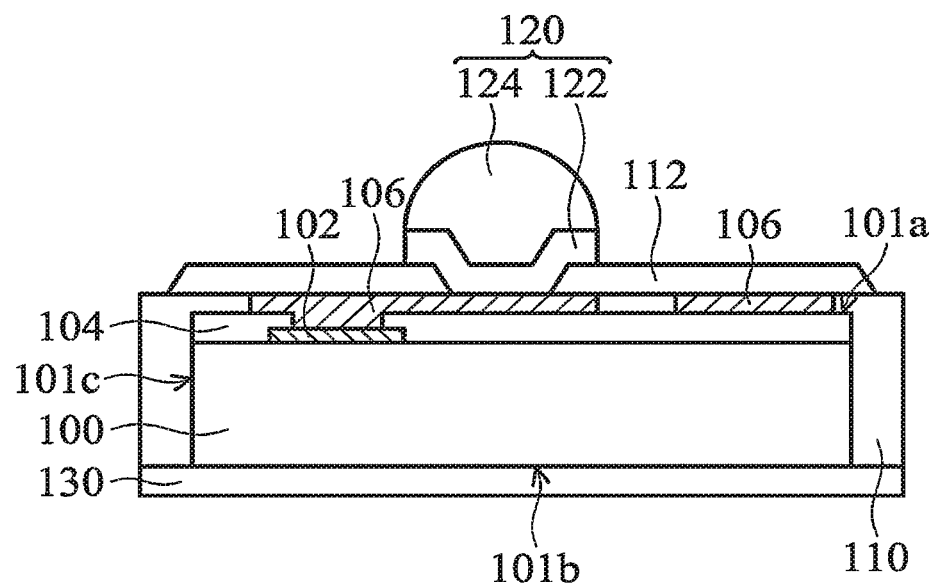
FIG. 2A is a cross-sectional view of an exemplary semiconductor package structure in accordance with some embodiments.

FIG. 2A is a cross-sectional view of an exemplary semiconductor package structure in accordance with some embodiments. In FIG. 2A, one of the semiconductor package structures 10a that is formed by dicing the formed structure shown in FIG. 1F is shown. Descriptions of elements of the embodiments hereinafter that are the same as or similar to those previously described with reference to FIGS. 1A to 1F may be omitted for brevity. In some embodiments, the semiconductor package structure 10a includes a semiconductor die that includes a substrate 100, at least one conductive pad 102 formed on the substrate 100, and an insulating layer 104 formed over the substrate 100 and having an opening to expose the conductive pad 102, as shown in FIG. 2A. The semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

In some embodiments, the semiconductor package structure 10a further includes a protective insulating layer 110 that covers the first surface 101a and the third surface 101c of the semiconductor die, and a protective insulating layer 130 that covers the second surface 101b of the semiconductor die. The thickness of the portion of the protective insulating layer 110 covering the first surface 101a and the thickness of the of the portion of the protective insulating layer 110 covering the third surface 101c of the semiconductor die can be adjusted, so as to fine-tune the protection ability of the semiconductor package structure 10a.

In some embodiments, the protective insulating layer 110 and the protective insulating layer 130 are made of the same material or different materials. For example, such a material may include an epoxy molding compound (EMC), an Ajinomoto™ Build-up Film (ABF), or an acrylic-based material. Alternatively, the protective insulating layer 110 is made of an epoxy molding compound (EMC), an Ajinomoto™ Build-up Film (ABF), or an acrylic-based material, and the protective insulating layer 130 is made of a DBF material that includes a thermoset material, such as an epoxy resin material.

In some embodiments, the semiconductor package structure 10a further includes an RDL structure 106 electrically coupled to the semiconductor die via the conductive pad 102 and surrounded by the protective insulating layer 110 on the first surface 101a of the semiconductor die.

In some embodiments, the semiconductor package structure 10a further includes a passivation layer 112 covering the RDL structure 106 and a portion of the protective insulating layer 110 surrounding the RDL structure 106. The passivation layer 112 may be made of polyimide or polybenzoxazole (PBO).

In some embodiments, the semiconductor package structure 10a further includes at least one conductive structure 120 that includes an optional UBM layer 122 and a solder bump 124 and passes through the passivation layer 112, so as to be electrically coupled to the semiconductor die through the RDL structure 106.

In some embodiments, the semiconductor package structure 10a shown in FIG. 2A is a CSP structure. The CSP structure may include an SOC package. Moreover, the semiconductor package structure 10a may be mounted on a base (not shown). The base may include a printed circuit board (PCB) and may be formed of polypropylene (PP). Alternatively, the base may include a package substrate. The semiconductor package structure 10a may be mounted on the base by a bonding process. For example, the semiconductor package structure 10a may be mounted on the base by the bonding process and electrically coupled to the base using the conductive structures 120 as connectors.

Figure 2B:
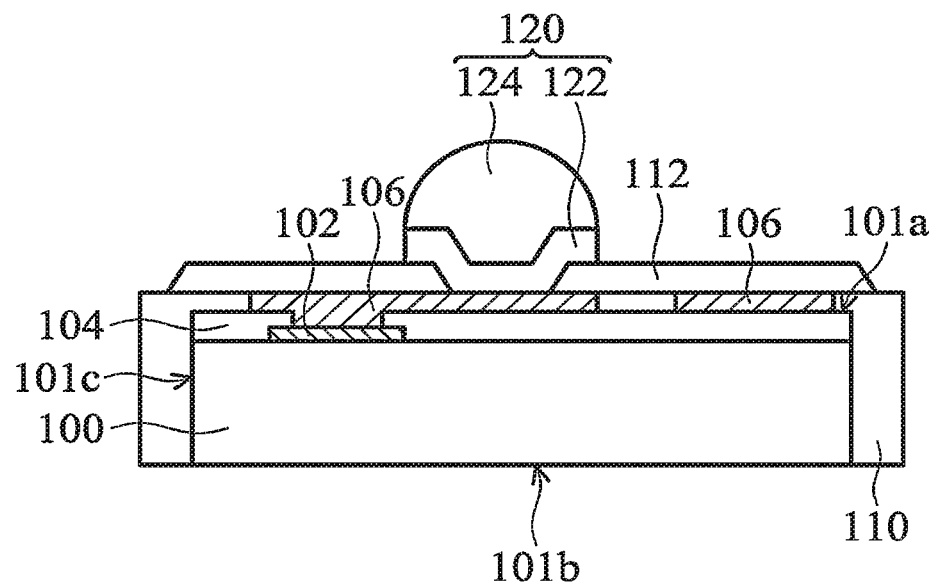
FIG. 2B is a cross-sectional view of an exemplary semiconductor package structure in accordance with some embodiments.

FIG. 2B is a cross-sectional view of an exemplary semiconductor package structure in accordance with some embodiments. Descriptions of elements of the embodiments hereinafter that are the same as or similar to those previously described with reference to FIG. 2A may be omitted for brevity. In some embodiments, the semiconductor package structure 10b is similar to the semiconductor package structure 10a shown in FIG. 2A. Compared to the semiconductor package structure 10a, there is no protective insulating layer 130 formed in the package structure 10b, and hence the second surface 101b of the semiconductor die is exposed to the environment. In some embodiments, the semiconductor package structure 10b is formed by a method that is similar to the method shown in FIGS. 1A to 1F, except that the formation of the protective insulating layer 130, as shown in FIG. 1F, is omitted. Namely, after the structure shown in FIG. 1E is formed, a singulation is carried out to saw through the formed structure shown in FIG. 1E.

Figure 3A:
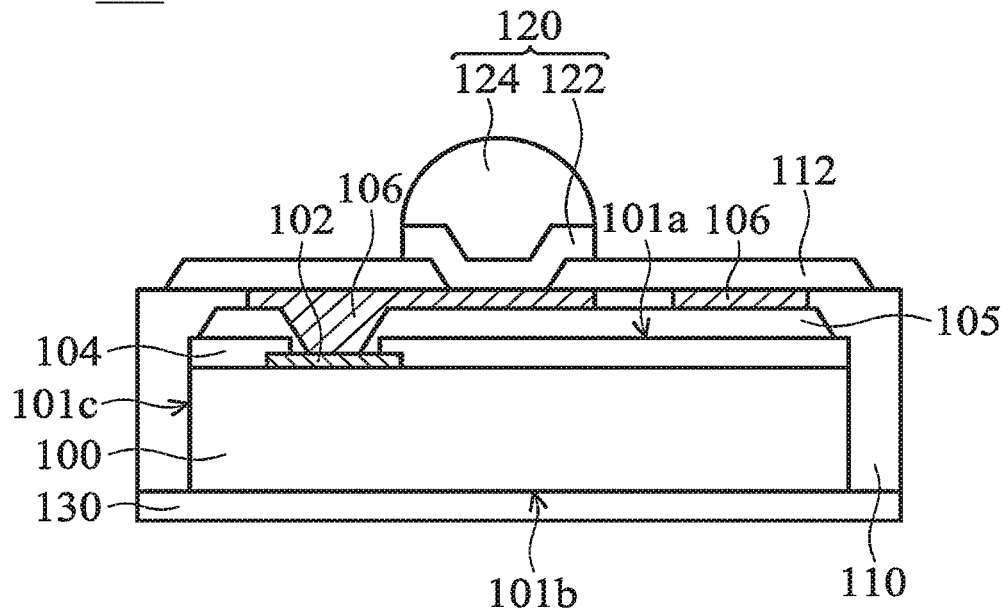
FIG. 3A is a cross-sectional view of an exemplary semiconductor package structure in accordance with some embodiments.

FIG. 3A is a cross-sectional view of an exemplary semiconductor package structure in accordance with some embodiments. Descriptions of elements of the embodiments hereinafter that are the same as or similar to those previously described with reference to FIG. 2A may be omitted for brevity. In some embodiments, the semiconductor package structure 10c is similar to the semiconductor package structure 10a shown in FIG. 2A. Compared to the semiconductor package structure 10a, the semiconductor package structure 10c further includes a passivation layer 105 formed between the first surface 101a of the semiconductor die and the RDL structure 106 and covered by the protective insulating layer 110. In some embodiments, the material and the method used for the passivation layer 105 are the same as or similar to those used for the passivation layer 112. For example, the passivation layer 105 is made of polyimide or polybenzoxazole (PBO). In some embodiments, the semiconductor package structure 10c is formed by a method that is similar to the method shown in FIGS. 1A to 1F, except that an additional passivation layer 105 is formed prior to the formation of the RDL structure 106. Prior to the formation of the RDL structure 106, at least one opening is formed in the passivation layer 105, so that the passivation layer 105 exposes the conductive pad 102 and surrounds the opening formed in the insulating layer 104.

Figure 3B:
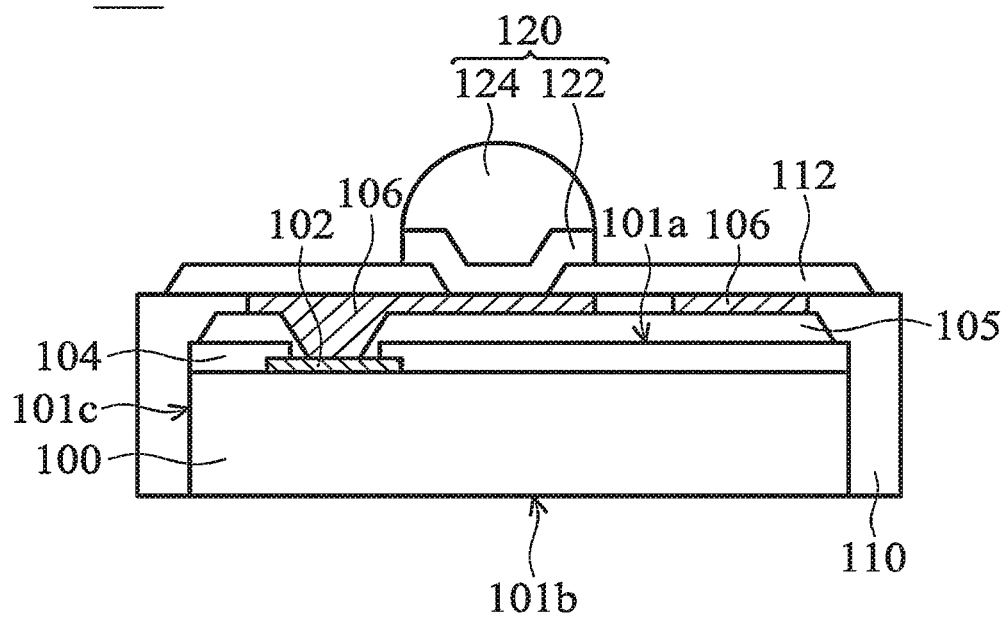
FIG. 3B is a cross-sectional view of an exemplary semiconductor package structure in accordance with some embodiments.

FIG. 3B is a cross-sectional view of an exemplary semiconductor package structure in accordance with some embodiments. Descriptions of elements of the embodiments hereinafter that are the same as or similar to those previously described with reference to FIGS. 2A and 3A may be omitted for brevity. In some embodiments, the semiconductor package structure 10d is similar to the semiconductor package structure 10c shown in FIG. 3A. Compared to the semiconductor package structure 10c, there is no protective insulating layer 130 formed in the package structure 10d, and hence the second surface 101b of the semiconductor die is exposed to the environment. In some embodiments, the semiconductor package structure 10d is formed by a method that is similar to the method used for forming the semiconductor package structure 10c, except that the formation of the protective insulating layer 130 is omitted.

Figure 4A:
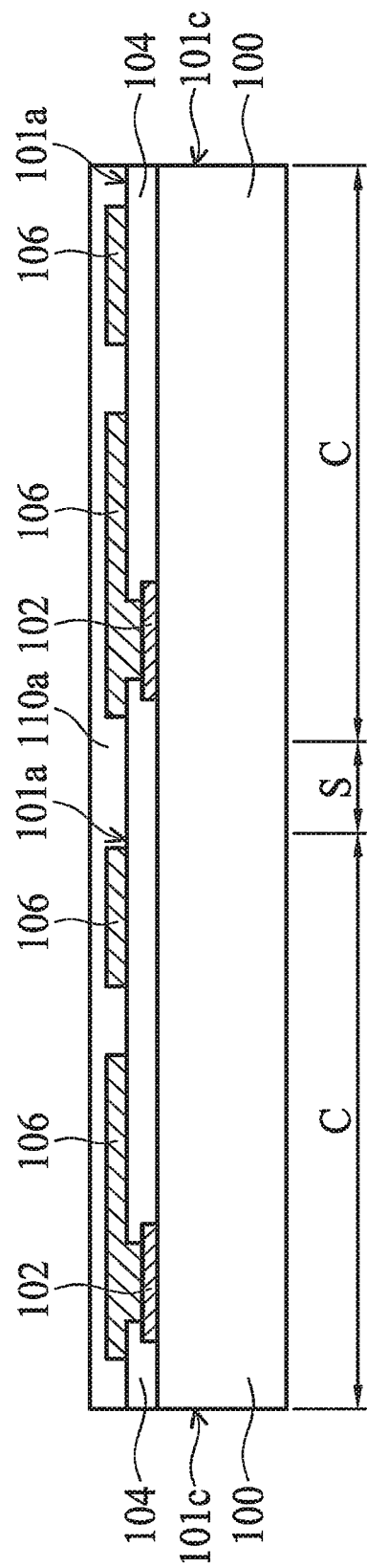
FIGS. 4A to 4E are cross-sectional views of an exemplary method of forming a semiconductor package structure in accordance with some embodiments.

FIGS. 4A to 4E are cross-sectional views of an exemplary method of forming a semiconductor package structure in accordance with some embodiments of the disclosure. Descriptions of elements of the embodiments hereinafter that are the same as or similar to those previously described with reference to FIGS. 1A to 1F may be omitted for brevity. As shown in FIG. 4A, a structure as shown in FIG. 1A is provided. Afterwards, a protective insulating layer 110a is formed to cover the first surface 101a of each semiconductor die and surround each RDL structure 106, so that the top surfaces and sidewalls of the RDL structures 106 are covered or encapsulated by the protective insulating layer 110a.

In some embodiments, the protective insulating layer 110a is made of an epoxy molding compound (EMC), an Ajinomoto™ Build-up Film (ABF), or an acrylic-based material. In some embodiments, the protective insulating layer 110a is formed by a coating process, a molding process, or another suitable process.

Figure 4B:
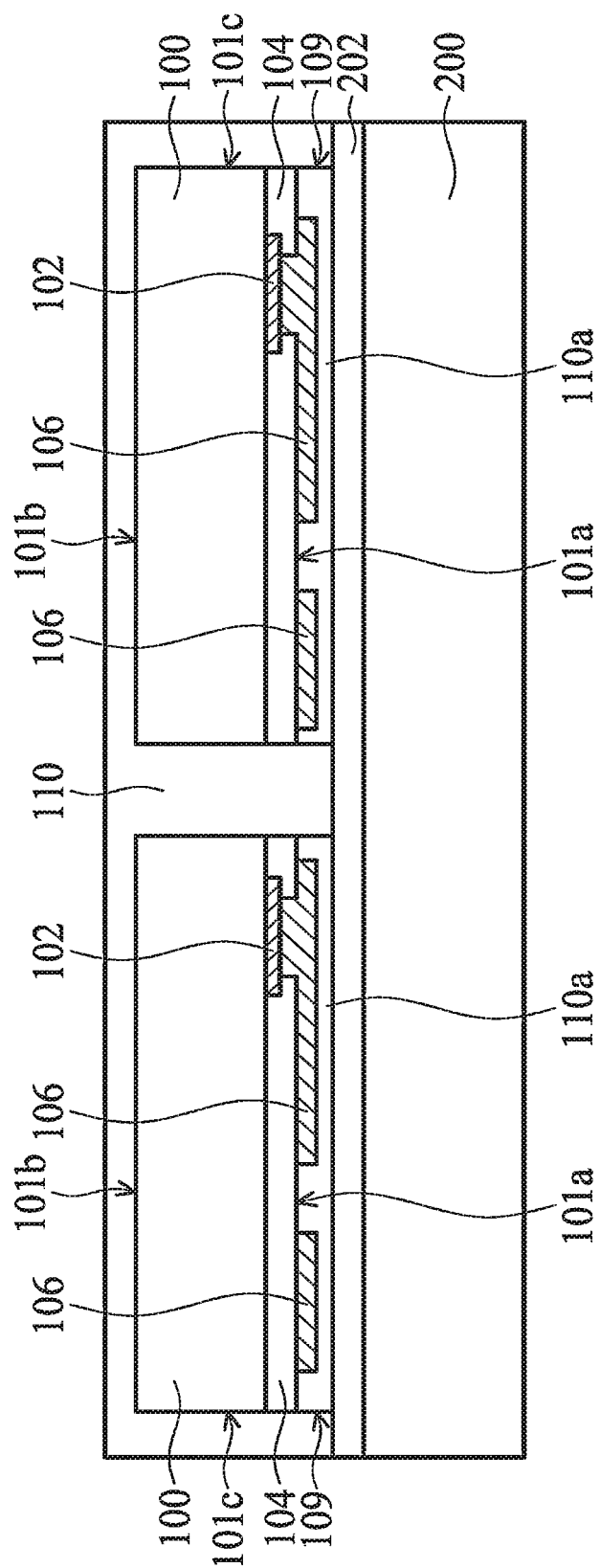

As shown in FIG. 4B, in some embodiments, after the protective insulating layer 110a is formed, the chip regions C are separated from each other by dicing the scribe line region S of the substrate 100 to form semiconductor dies with the RDL structures 106 thereon. The formed semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b. Moreover, the protective insulating layer 110a has a sidewall 109 that is substantially aligned with the third surface 101c of the semiconductor die.

Still referring to FIG. 4B, in some embodiments, a carrier substrate 200 with an adhesive layer 202 formed thereon is provided. Afterwards, in some embodiments, each of the formed semiconductor dies with an RDL structure 106 formed on the first surface 101a of the semiconductor die is mounted onto the carrier substrate 200 by attaching the top surface of the protective insulating layer 110a to the adhesive layer 202 using a pick-and-place process. As a result, the second surface 101b of each semiconductor die is opposite the carrier substrate 200.

Next, in some embodiments, a protective insulating layer 110 is formed using a molding process to cover the second surface 101b and the third surface 101c of the semiconductor dies and surround the protective insulating layer 110a, so that the protective insulating layer 110 extends from the third surface 101c of each semiconductor die to the sidewall 109 of the respective protective insulating layer. As a result, each of the formed semiconductor dies with an RDL structure 106 thereon is encapsulated by a protective structure including the protective insulating layer 110a and the protective insulating layer 110.

In some embodiments, the protective structure protects the semiconductor dies from the environment, thereby preventing the semiconductor die in the subsequently formed semiconductor package structure from damage due to, for example, the stress, the chemicals and/or the moisture. In some embodiments, the protective insulating layer 110 of the protective structure is formed by a molding process while the protective insulating layer 110a of the protective structure is formed by a coating process.

Figure 4C:
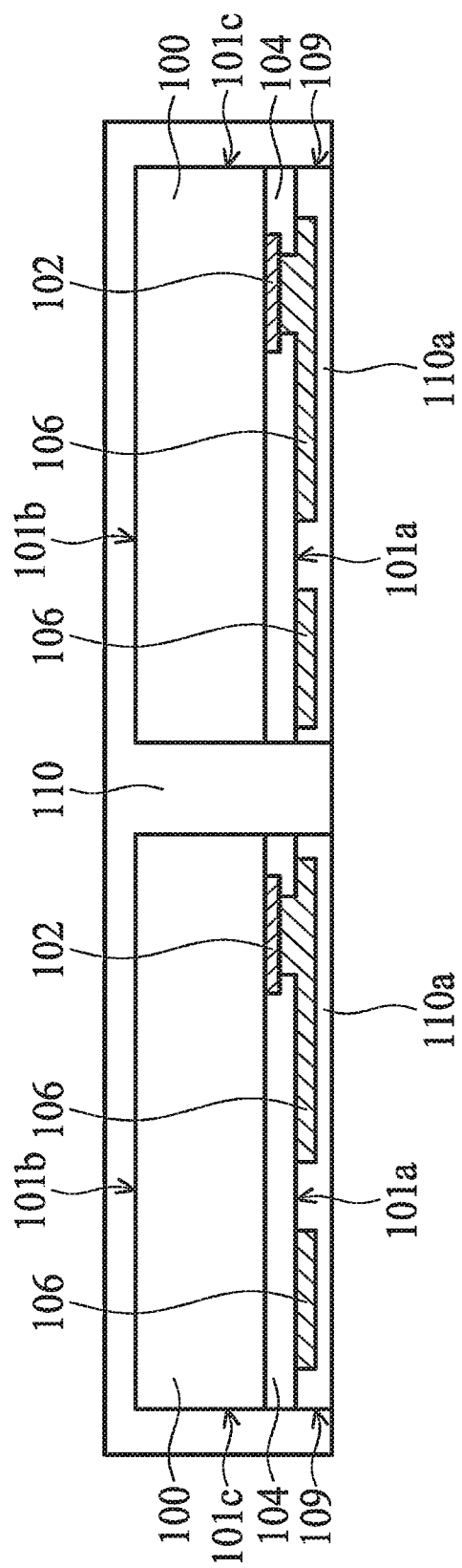

After the protective structure is formed, the semiconductor dies with RDL structures 106 encapsulated by the protective structure are de-bonded from the carrier substrate 200 by a de-bonding process as shown in FIG. 1C. The resulting structure is shown in FIG. 4C.

Figure 4D:
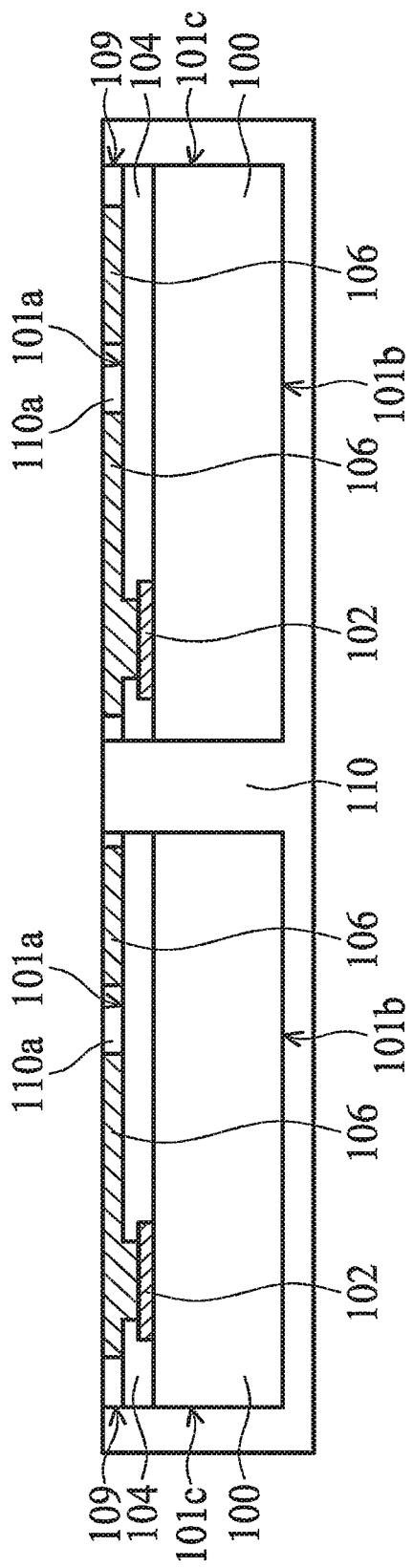

In some embodiments, after the carrier substrate 200 is removed by the de-bonding process, a grinding process is performed on the protective insulating layer 110a above the RDL structures 106 and a portion of the protective insulating layer 110 surrounding the protective insulating layer 110a until the RDL structures 106 are exposed from the protective insulating layer 110a, as shown in FIG. 4D. For example, the protective insulating layer 110a and the protective insulating layer 110 may be grinded by a CMP process or another suitable grinding process.

Figure 4E:
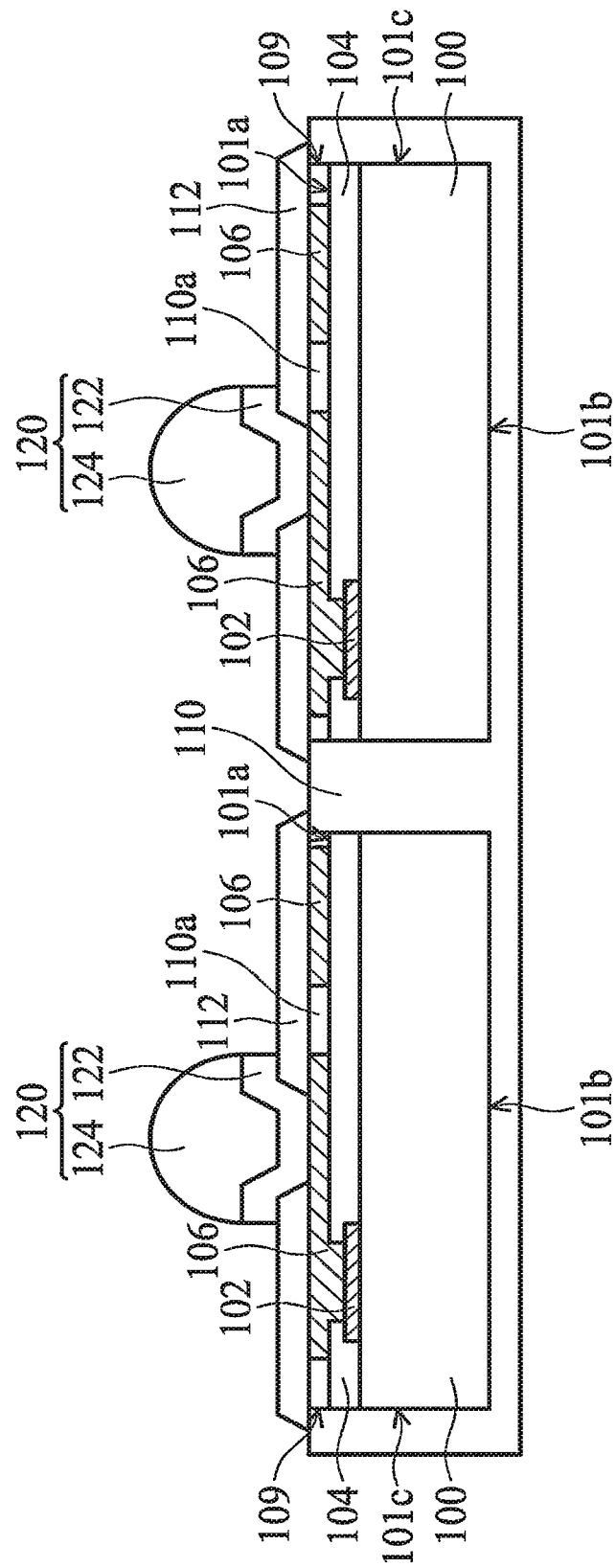

Afterwards, the protective insulating layer 110a and the RDL structures 106 are covered with a patterned passivation layer 112, as shown in FIG. 4E. In some embodiments, the passivation layer 112 is made of a material that is different from the material of the protective insulating layer 110a and the material of the protective insulating layer 110. In some embodiments, during patterning the passivation layer 112, the passivation layer 112 is also divided into several portions, so that each of the semiconductor dies is covered by a respective portion of passivation layer 112. In some other embodiments, the passivation layer 112 is divided into several portions by the subsequent dicing process.

After openings are formed in the passivation layer 112, conductive structures 120 including an optional UBM layer 122 and a solder bump 124 respectively pass through the passivation layer 112 via those openings, as shown in FIG. 4E. As a result, each of the conductive structures 120 is electrically coupled to the respective exposed RDL structure 106.

In some embodiments, after the conductive structures 120 is formed, a singulation (e.g., a dicing process) is carried out to saw through the formed structure shown in FIG. 4E. As a result, multiple separate semiconductor package structures are formed.

Figure 5A:
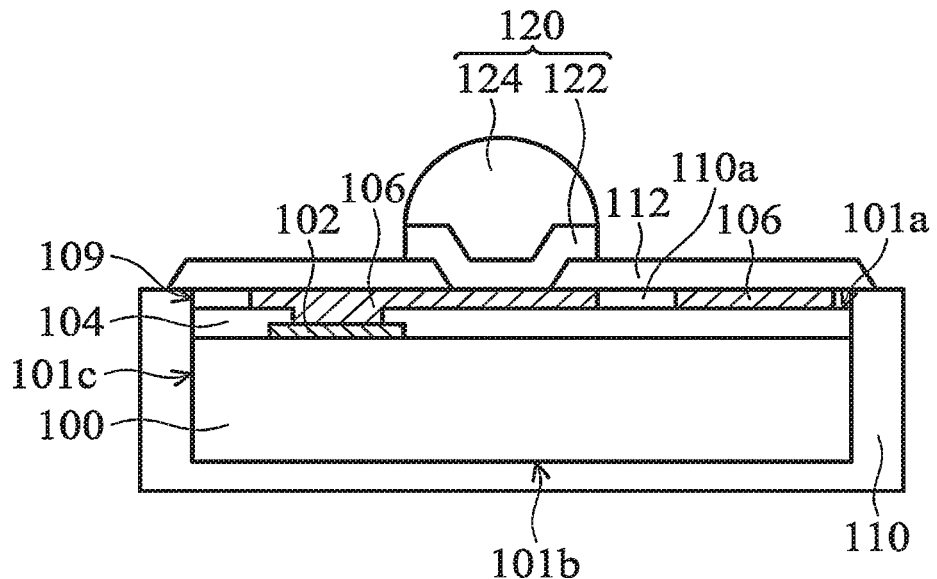
FIG. 5A is a cross-sectional view of an exemplary semiconductor package structure in accordance with some embodiments.

FIG. 5A is a cross-sectional view of an exemplary semiconductor package structure in accordance with some embodiments. In FIG. 5A, one of the semiconductor package structures 20a that is formed by dicing the formed structure shown in FIG. 4E is shown. Descriptions of elements of the embodiments hereinafter that are the same as or similar to those previously described with reference to FIGS. 4A to 4E may be omitted for brevity. In some embodiments, the semiconductor package structure 20a includes a semiconductor die that includes a substrate 100, at least one conductive pad 102 formed on the substrate 100, and an insulating layer 104 formed over the substrate 100 and having an opening to expose the conductive pad 102, as shown in FIG. 5A. The semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

In some embodiments, the semiconductor package structure 20a further includes a protective insulating layer 110a that covers the first surface 101a of the semiconductor die, and a protective insulating layer 110 that covers the second surface 101b and the third surface 101c of the semiconductor die and that surrounds the protective insulating layer 110a. The protective insulating layer 110a has a sidewall 109 that is substantially aligned with the third surface 101c of the semiconductor die. The protective insulating layer 110 extends from the third surface 101c of the semiconductor die to the sidewall 109 of the protective insulating layer 110a. The thickness of the protective insulating layer 110a covering the first surface 101a and the thickness of the protective insulating layer 110 covering the second surface 101b and the third surface 101c of the semiconductor die can be adjusted, so as to fine-tune the protection ability of the semiconductor package structure 20a.

In some embodiments, the protective insulating layer 110a and the protective insulating layer 110 are made of the same material or different materials. For example, such a material may include an epoxy molding compound (EMC), an Ajinomoto™ Build-up Film (ABF), or an acrylic-based material.

In some embodiments, the semiconductor package structure 20a further includes an RDL structure 106 electrically coupled to the semiconductor die via the conductive pad 102 and surrounded by the protective insulating layer 110a.

In some embodiments, the semiconductor package structure 20a further includes a passivation layer 112 covering the RDL structure 106 and a portion of the protective insulating layer 110a surrounding the RDL structure 106. Moreover, the passivation layer 112 is made of for example, polyimide or polybenzoxazole (PBO).

In some embodiments, the semiconductor package structure 20a further includes at least one conductive structure 120 that includes an optional UBM layer 122 and a solder bump 124 and passes through the passivation layer 112, so as to be electrically coupled to the semiconductor die through the RDL structure 106.

In some embodiments, the semiconductor package structure 20a shown in FIG. 5A is a CSP structure. The CSP structure may include an SOC package. Moreover, the semiconductor package structure 20a may be mounted on a base (not shown). The base may include a printed circuit board (PCB) and may be formed of polypropylene (PP). Alternatively, the base may include a package substrate. Similar to the semiconductor package structure 10a, the semiconductor package structure 20a may be mounted on the base by a bonding process and electrically coupled to the base using the conductive structures 120 as connectors.

Figure 5B:
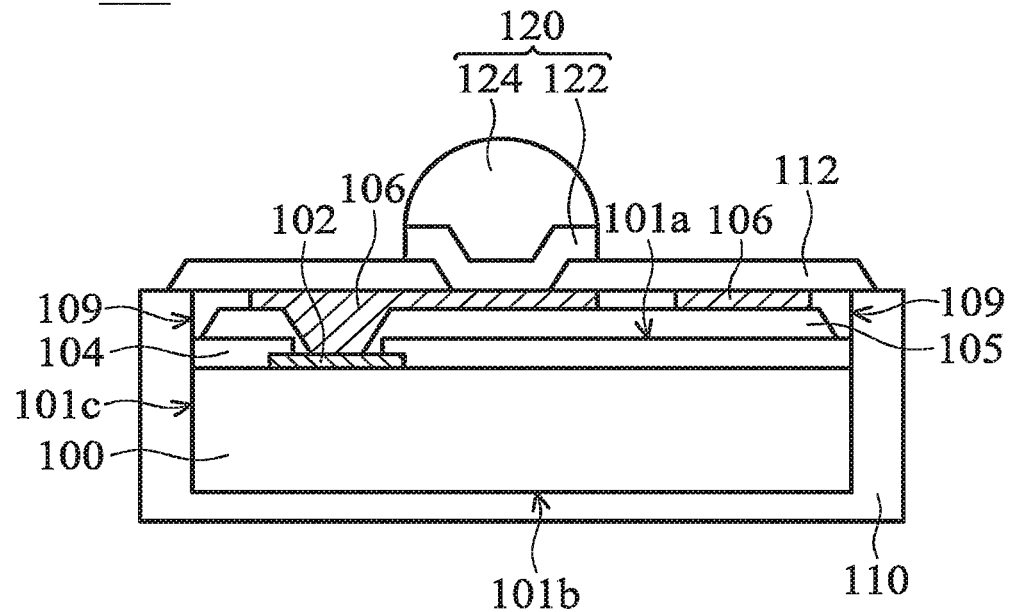
FIG. 5B is a cross-sectional view of an exemplary semiconductor package structure in accordance with some embodiments.

FIG. 5B is a cross-sectional view of an exemplary semiconductor package structure in accordance with some embodiments. Descriptions of elements of the embodiments hereinafter that are the same as or similar to those previously described with reference to FIG. 5A may be omitted for brevity. In some embodiments, the semiconductor package structure 20b is similar to the semiconductor package structure 20a shown in FIG. 5A. Compared to the semiconductor package structure 20a, the semiconductor package structure 20b further includes a passivation layer 105 formed between the first surface 101a of the semiconductor die and the RDL structure 106 and covered by the protective insulating layer 110a. In some embodiments, the material and the method used for the passivation layer 105 are the same as or similar to those used for the passivation layer 112 and different from those used for the protective insulating layer 110a and those used for the protective insulating layer 110. In some embodiments, the semiconductor package structure 20b is formed by a method that is similar to the method shown in FIGS. 4A to 4E, except that an additional passivation layer 105 is formed prior to the formation of the RDL structure 106. Prior to the formation of the RDL structure 106, at least one opening is formed in the passivation layer 105, so that the passivation layer 105 exposes the conductive pad 102 and surrounds the opening formed in the insulating layer 104.

Figure 6A:
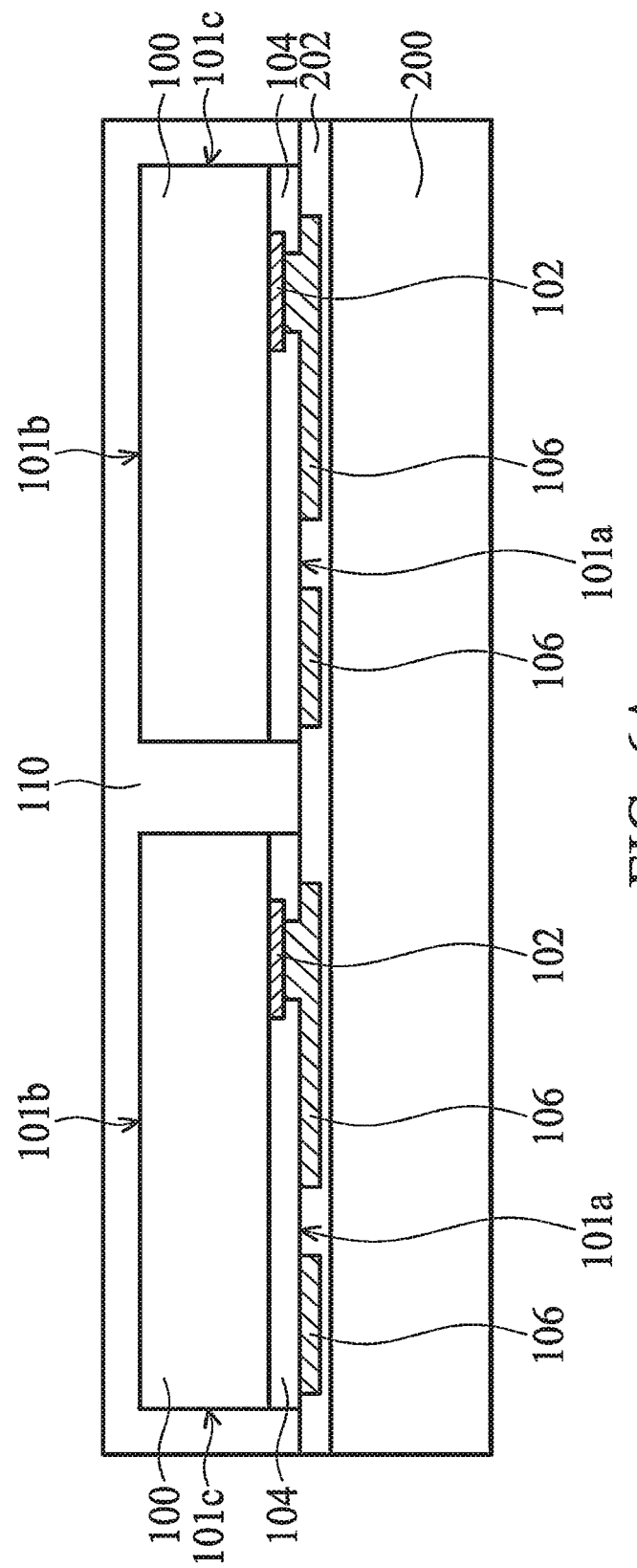
FIGS. 6A to 6E are cross-sectional views of an exemplary method of forming a semiconductor package structure in accordance with some embodiments.

FIGS. 6A to 6E are cross-sectional views of an exemplary method of forming a semiconductor package structure in accordance with some embodiments of the disclosure. Descriptions of elements of the embodiments hereinafter that are the same as or similar to those previously described with reference to FIGS. 1A to 1F or 4A to 4E may be omitted for brevity. As shown in FIG. 6A, a structure as shown in FIG. 1A is provided. Afterwards, the chip regions C are separated from each other by dicing the scribe line region S of the substrate 100 to form semiconductor dies with the RDL structures 106 thereon. The formed semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

As shown in FIG. 6A, in some embodiments, a carrier substrate 200 with an adhesive layer 202 formed thereon is provided. Afterwards, in some embodiments, each of the formed semiconductor dies with an RDL structure 106 formed on the first surface 101a of the semiconductor die is mounted onto the carrier substrate 200 by attaching the top surface and sidewall surface of the RDL structure 106 to the adhesive layer 202 using a pick-and-place process. As a result, the second surface 101b of each semiconductor die is opposite the carrier substrate 200.

Next, in some embodiments, a protective insulating layer 110 is formed using a molding process to cover the second surface 101b and the third surface 101c of the semiconductor dies and surround the protective insulating layer 110a, so that the protective insulating layer 110 extends from the third surface 101c of each semiconductor die to the sidewall 109 of the respective protective insulating layer.

Figure 6B:
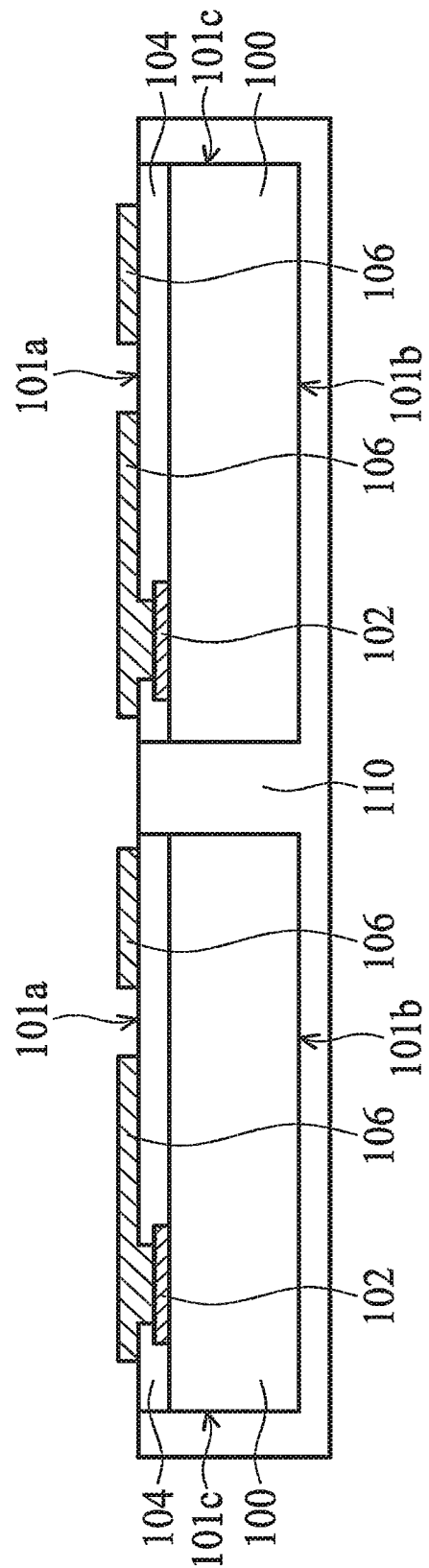

In some embodiments, after the protective insulating layer 110 is formed, the semiconductor dies with RDL structures 106 are de-bonded from the carrier substrate 200 by a de-bonding process (as shown in FIG. 1C). The resulting structure is shown in FIG. 6B.

Figure 6C:
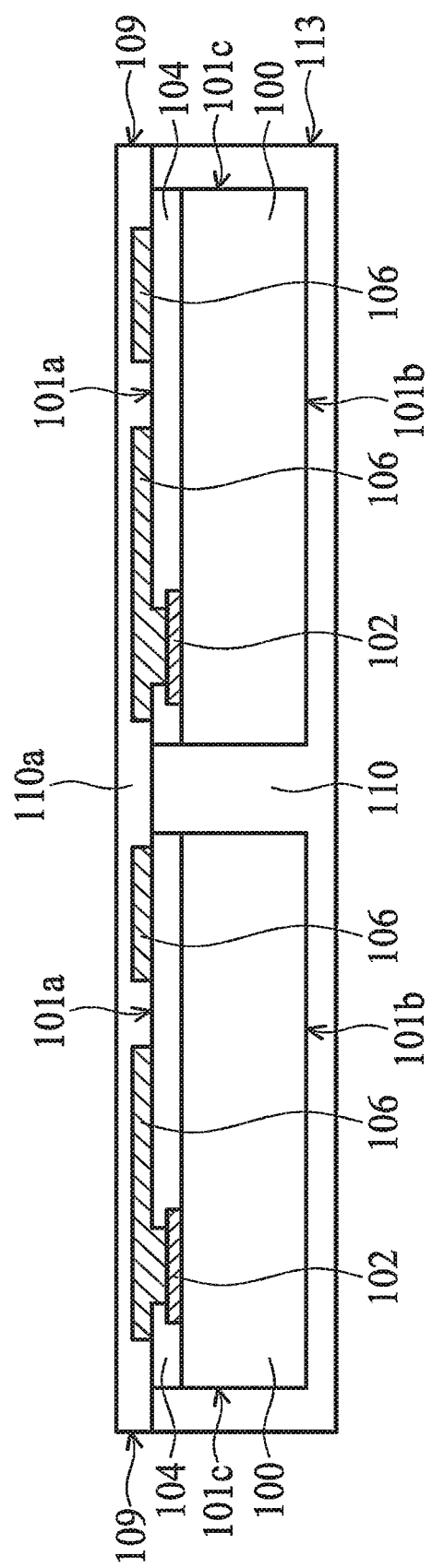

In some embodiments, after the de-bonding process, a protective insulating layer 110a is formed by a coating process to cover the first surface 101a of each semiconductor die and surround each RDL structure 106, as shown in FIG. 6C. As a result, the top surfaces and sidewalls of the RDL structures 106 are covered or encapsulated by the protective insulating layer 110a. Moreover, a portion of the protective insulating layer 110 covering the third surface 101c of the semiconductor die is capped by the protective insulating layer 110a. In some other embodiments, the protective insulating layer 110a is formed by a molding process or another suitable process.

Due to the formation of a protective structure including the protective insulating layer 110a and the protective insulating layer 110, each of the formed semiconductor dies with an RDL structure 106 thereon is encapsulated. The protective structure protects the semiconductor dies from the environment, thereby preventing the semiconductor die in the subsequently formed semiconductor package structure from damage due to, for example, the stress, the chemicals and/or the moisture.

Figure 6D:
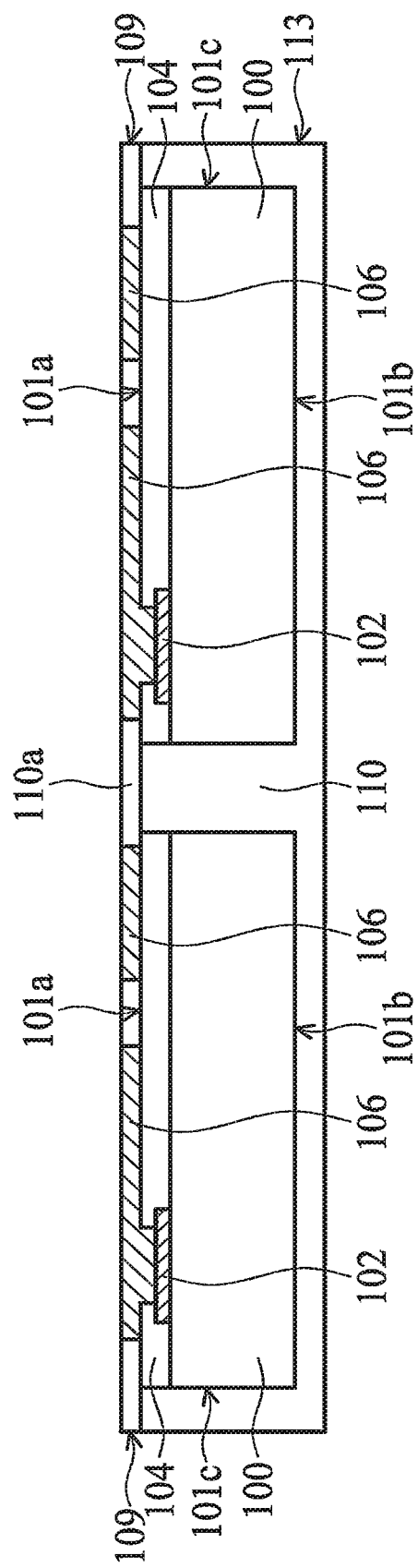

In some embodiments, after the protective structure is formed, a grinding process is performed on the protective insulating layer 110a above the RDL structures 106 until the RDL structures 106 are exposed from the protective insulating layer 110a, as shown in FIG. 6D. For example, the protective insulating layer 110a may be grinded by a CMP process or another suitable grinding process.

Figure 6E:
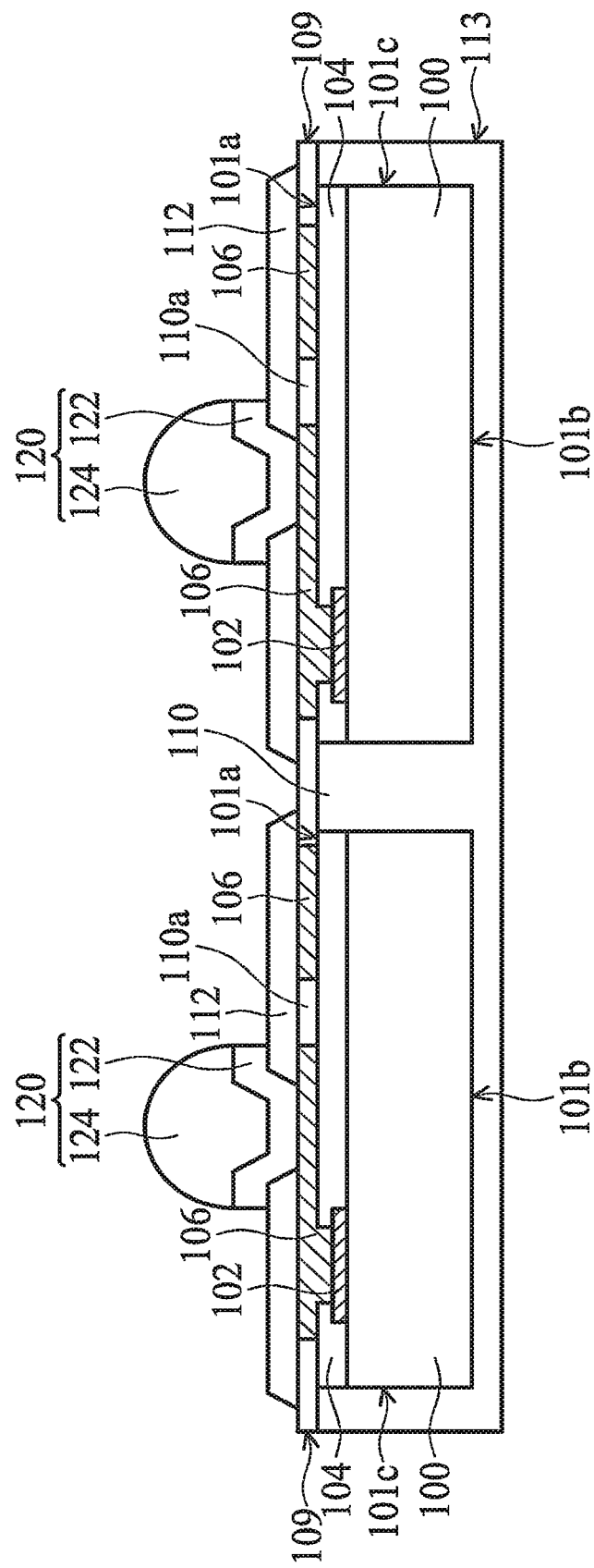

Afterwards, the protective insulating layer 110a and the RDL structures 106 are covered with a patterned passivation layer 112, as shown in FIG. 6E. In some embodiments, the passivation layer 112 is made of a material that is different from the material of the protective insulating layer 110a and the material of the protective insulating layer 110. In some embodiments, during patterning the passivation layer 112, the passivation layer 112 is also divided into several portions, so that each of the semiconductor dies is covered by a respective portion of passivation layer 112. In some other embodiments, the passivation layer 112 is divided into several portions by the subsequent dicing process.

After openings are formed in the passivation layer 112, conductive structures 120 including an optional UBM layer 122 and a solder bump 124 respectively pass through the passivation layer 112 via those openings, as shown in FIG.

6E. As a result, each of the conductive structures 120 is electrically coupled to the respective exposed RDL structure 106.

In some embodiments, after the conductive structures 120 is formed, a singulation (e.g., a dicing process) is carried out to saw through the formed structure shown in FIG. 6E. As a result, multiple separate semiconductor package structures are formed. In some embodiments, in the semiconductor package structure, the protective insulating layer 110a has a sidewall and a portion of the protective insulating layer covering the third surface 101c of the semiconductor die has a sidewall, and those sidewalls are substantially aligned with each other.

Figure 7A:
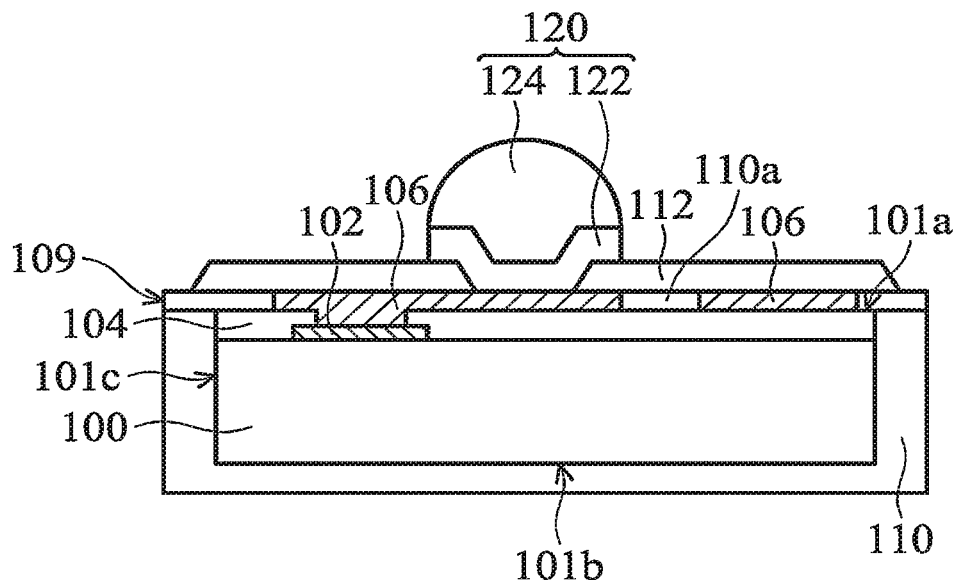
FIG. 7A is a cross-sectional view of an exemplary semiconductor package structure in accordance with some embodiments.

FIG. 7A is a cross-sectional view of an exemplary semiconductor package structure in accordance with some embodiments. In FIG. 7A, one of the semiconductor package structures 30a that is formed by dicing the formed structure shown in FIG. 6E is shown. Descriptions of elements of the embodiments hereinafter that are the same as or similar to those previously described with reference to FIGS. 1A to 1F or 4A to 4E may be omitted for brevity. In some embodiments, the semiconductor package structure 30a includes a semiconductor die that includes a substrate 100, at least one conductive pad 102 formed on the substrate 100, and an insulating layer 104 formed over the substrate 100 and having an opening to expose the conductive pad 102, as shown in FIG. 7A. The semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

In some embodiments, the semiconductor package structure 30a further includes a protective insulating layer 110a that covers the first surface 101a of the semiconductor die, and a protective insulating layer 110 that covers the second surface 101b and the third surface 101c of the semiconductor die and that surrounds the protective insulating layer 110a. The protective insulating layer 110a has a sidewall 109 and a portion of the protective insulating layer 110a covering the third surface 101c of the semiconductor die has a sidewall 113. In some embodiments, the sidewall 109 is substantially aligned with the sidewall 113. Moreover, the portion of the protective insulating layer 110 covering the third surface 101c of the semiconductor die is capped by the protective insulating layer 110a. The thickness of the protective insulating layer 110a covering the first surface 101a and the thickness of the protective insulating layer 110 covering the second surface 101b and the third surface 101c of the semiconductor die can be adjusted, so as to fine-tune the protection ability of the semiconductor package structure 30a.

In some embodiments, the protective insulating layer 110a and the protective insulating layer 110 are made of the same material or different materials. For example, such a material may include an epoxy molding compound (EMC), an Ajinomoto™ Build-up Film (ABF), or an acrylic-based material.

In some embodiments, the semiconductor package structure 30a further includes an RDL structure 106 electrically coupled to the semiconductor die via the conductive pad 102 and surrounded by the protective insulating layer 110a.

In some embodiments, the semiconductor package structure 30a further includes a passivation layer 112 covering the RDL structure 106 and a portion of the protective insulating layer 110a surrounding the RDL structure 106. Moreover, the passivation layer 112 is made of for example, polyimide or polybenzoxazole (PBO).

In some embodiments, the semiconductor package structure 30a further includes at least one conductive structure 120 that includes an optional UBM layer 122 and a solder bump 124 and passes through the passivation layer 112, so as to be electrically coupled to the semiconductor die through the RDL structure 106.

In some embodiments, the semiconductor package structure 30a shown in FIG. 7A is a CSP structure. The CSP structure may include an SOC package. Moreover, the semiconductor package structure 30a may be mounted on a base (not shown). The base may include a printed circuit board (PCB) and may be formed of polypropylene (PP). Alternatively, the base may include a package substrate. Similar to the semiconductor package structure 10a or 20a, the semiconductor package structure 30a may be mounted on the base by a bonding process and electrically coupled to the base using the conductive structures 120 as connectors.

Figure 7B:
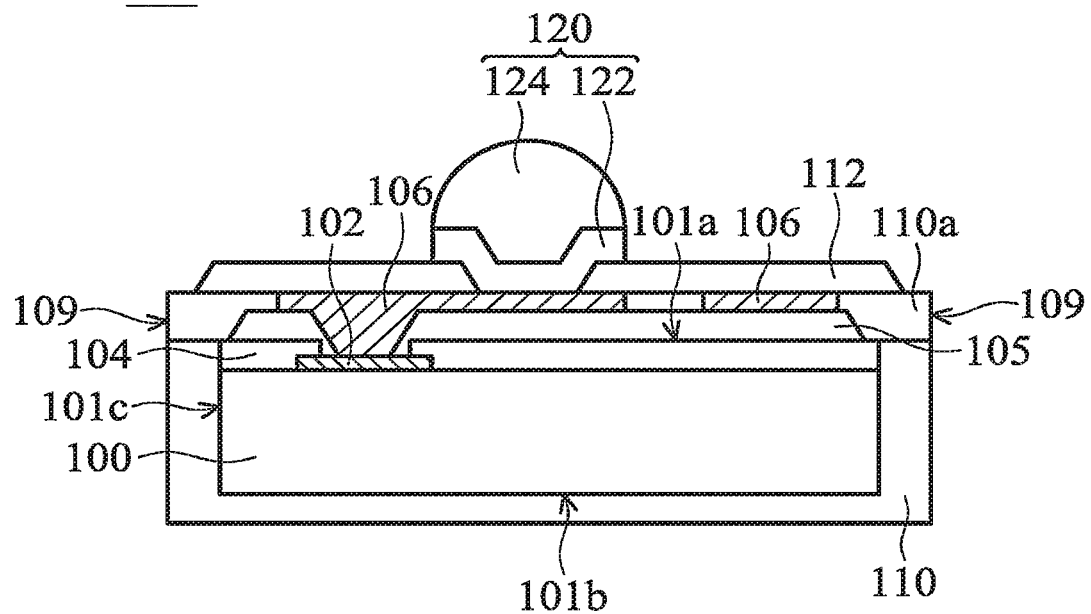
FIG. 7B is a cross-sectional view of an exemplary semiconductor package structure in accordance with some embodiments.

FIG. 7B is a cross-sectional view of an exemplary semiconductor package structure in accordance with some embodiments. Descriptions of elements of the embodiments hereinafter that are the same as or similar to those previously described with reference to FIG. 7A may be omitted for brevity. In some embodiments, the semiconductor package structure 30b is similar to the semiconductor package structure 30a shown in FIG. 7A. Compared to the semiconductor package structure 30a, the semiconductor package structure 30b further includes a passivation layer 105 formed between the first surface 101a of the semiconductor die and the RDL structure 106 and covered by the protective insulating layer 110a. In some embodiments, the material and the method used for the passivation layer 105 are the same as or similar to those used for the passivation layer 112 and different from those used for the protective insulating layer 110a and those used for the protective insulating layer 110. In some embodiments, the semiconductor package structure 30b is formed by a method that is similar to the method shown in FIGS. 6A to 6E, except that an additional passivation layer 105 is formed prior to the formation of the RDL structure 106. Prior to the formation of the RDL structure 106, at least one opening is formed in the passivation layer 105, so that the passivation layer 105 exposes the conductive pad 102 and surrounds the opening formed in the insulating layer 104.

Figure 8A:
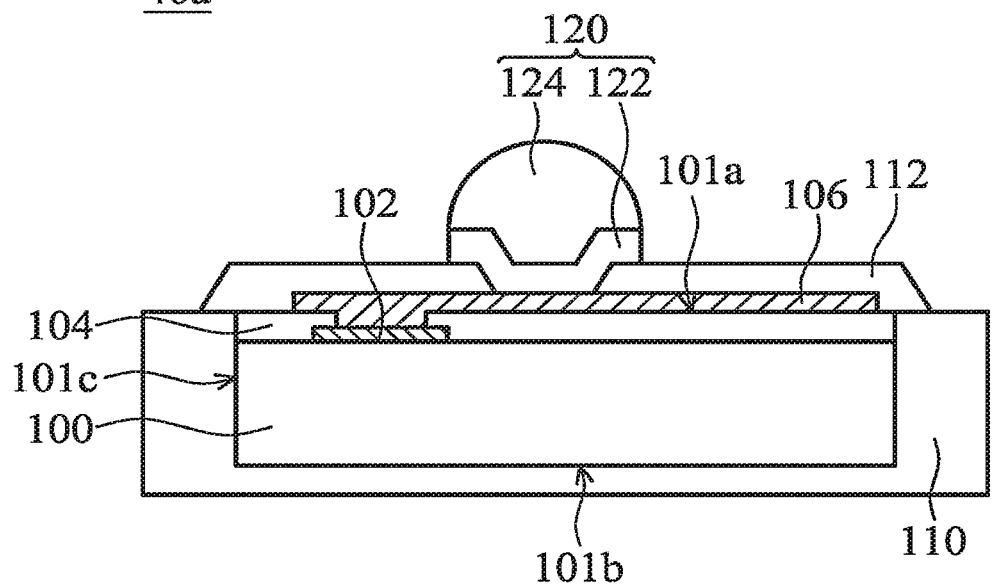
FIG. 8A is a cross-sectional view of an exemplary semiconductor package structure in accordance with some embodiments.

FIG. 8A is a cross-sectional view of an exemplary semiconductor package structure in accordance with some embodiments. Descriptions of elements of the embodiments hereinafter that are the same as or similar to those previously described with reference to FIG. 7A may be omitted for brevity. In some embodiments, the semiconductor package structure 40a is similar to the semiconductor package structure 30a shown in FIG. 7A. Compared to the semiconductor package structure 30a, the passivation layer 112 is formed on the RDL structure 106 and the protective insulating layer 110 without forming the protective insulating layer 110a in the semiconductor package structure 40a. In some embodiments, the semiconductor package structure 40a is formed by a method that is similar to the method illustrated in FIG. 7A, except that the protective insulating layer 110a is not formed. The passivation layer 112 may be formed after the formation of the RDL structure 106. As shown in FIG. 8A, the passivation layer 112 covers the sidewall of the RDL structure 106.

Figure 8B:
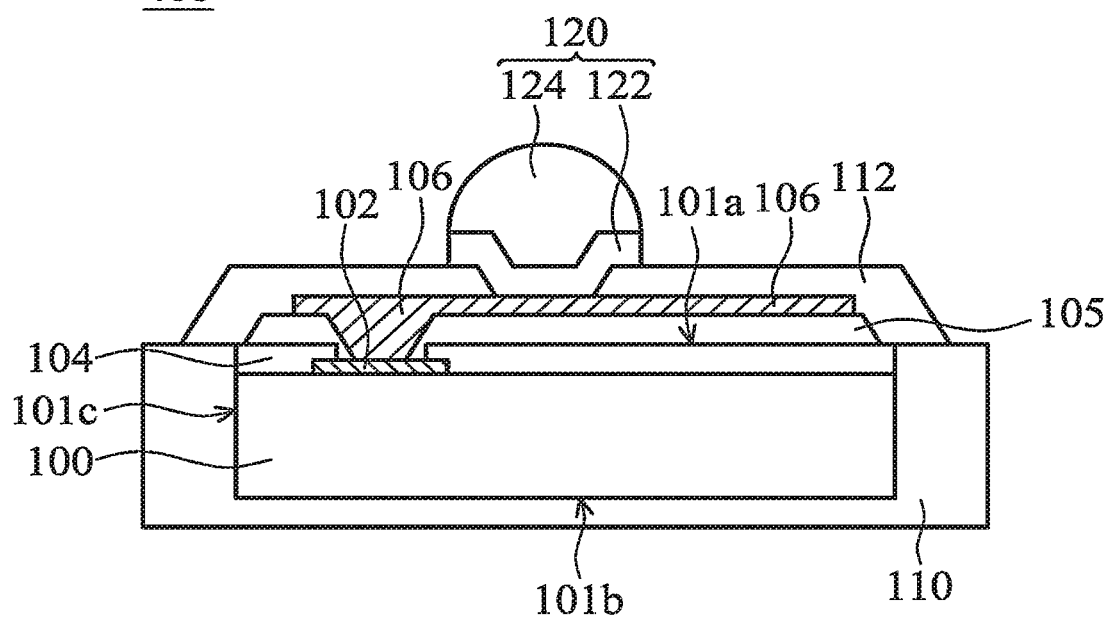
FIG. 8B is a cross-sectional view of an exemplary semiconductor package structure in accordance with some embodiments.

FIG. 8B is a cross-sectional view of an exemplary semiconductor package structure in accordance with some embodiments. Descriptions of elements of the embodiments hereinafter that are the same as or similar to those previously described with reference to FIG. 8A may be omitted for brevity. In some embodiments, the semiconductor package structure 40b is similar to the semiconductor package structure 40a shown in FIG. 8A. Compared to the semiconductor package structure 40a, the semiconductor package structure 40b further includes a passivation layer 105 formed between the first surface 101a of the semiconductor die and the RDL structure 106 and covered by the passivation layer 112. In some embodiments, the material and the method used for the passivation layer 105 are the same as or similar to those used for the passivation layer 112 and different from those used for the protective insulating layer 110. As shown in FIG. 8B, the passivation layer 112 covers the sidewall of the RDL structure 106 and the sidewall of the passivation layer 105.

In some embodiments, the semiconductor package structure 40b is formed by a method that is similar to the method illustrated in FIG. 8A, except that an additional passivation layer 105 is formed prior to the formation of the RDL structure 106. Prior to the formation of the RDL structure 106, at least one opening is formed in the passivation layer 105, so that the passivation layer 105 exposes the conductive pad 102 and surrounds the opening formed in the insulating layer 104.

Figure 9A:
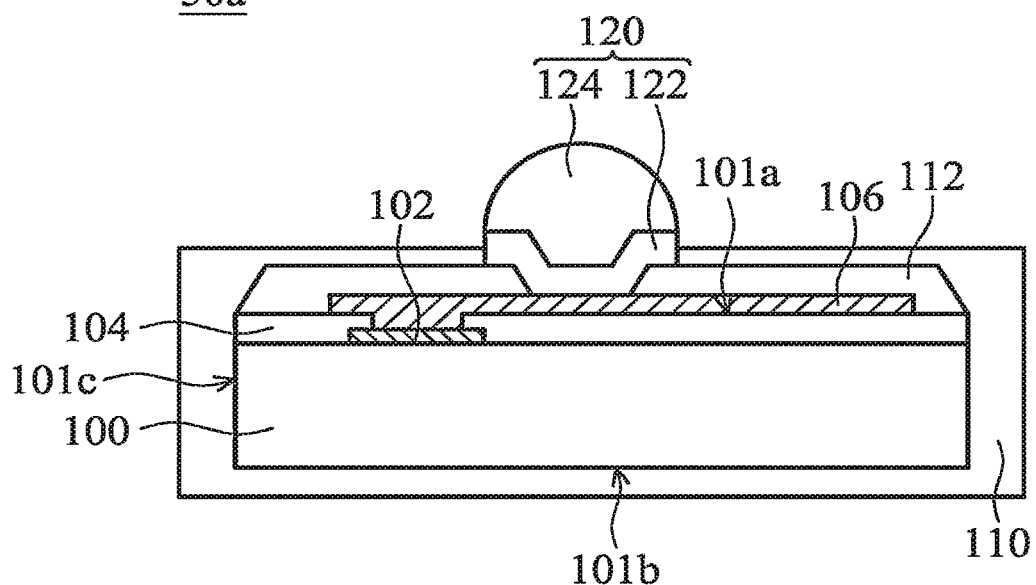
FIG. 9A is a cross-sectional view of an exemplary semiconductor package structure in accordance with some embodiments.

FIG. 9A is a cross-sectional view of an exemplary semiconductor package structure in accordance with some embodiments. Descriptions of elements of the embodiments hereinafter that are the same as or similar to those previously described with reference to FIG. 8A may be omitted for brevity. In some embodiments, the semiconductor package structure 50a is similar to the semiconductor package structure 40a shown in FIG. 8A. Compared to the semiconductor package structure 40a, the protective insulating layer 110 further covers the RDL structure 106 and the passivation layer 112 in the semiconductor package structure 50a.

In some embodiments, the semiconductor package structure 50a is formed by a method that is similar to the method illustrated in FIG. 8A, except that the protective insulating layer 110 is formed before the formation of the conductive structure 120 and after the formation of the passivation layer 112. In some embodiments, after the formation of the passivation layer 112, the protective insulating layer 110 is formed to cover the second surface 101b and the third surface 101c of the semiconductor die, the RDL structure 106, and the passivation layer 112. In other words, the embodiments according to FIGS. 1A-8B may be referred to as recon first, and the embodiments according to FIG. 9A may be referred to as recon last.

Next, at least one opening may be formed in the protective insulating layer 110 and passing through the passivation layer 112, so that the passivation layer 112 and the protective insulating layer 110 expose the RDL structure 106. Next, the conductive structure 120 is formed in the openings. In some embodiments, the conductive structure 120 includes an optional UBM layer 122 and a solder bump 124 on the UBM layer 122. In some other embodiments, the UBM layer 122 is not formed, and the conductive structure 120 includes a solder bump 124 on the passivation layer 112.

Various steps may be added, removed, rearranged and repeated. For example, in the embodiment where the conductive structure 120 including the UBM layer 122 and the solder bump 124, the protective insulating layer 110 may be formed after the formation of the UBM layer 122 and before the formation of the solder bump 124. In these embodiments, after the protective insulating layer 110 is formed, a grinding process is performed on the top surface of the protective insulating layer 110 until the UBM layer 122 is exposed from the protective insulating layer 110. For example, the top surface of the protective insulating layer 110 may be grinded by a chemical mechanical polishing (CMP) process or another suitable grinding process. Next, the solder bump 124 is formed on the exposed UBM layer 122.

In some embodiments, the edge of the passivation layer 112 is aligned with the third surface 101c of the semiconductor die as shown in FIG. 9A, but the present disclosure is not limit thereto. For example, the edge of the passivation layer 112 may be disposed inside the first surface 101a of the semiconductor die in some other embodiments. In these embodiments, a portion of the first surface 101a of the semiconductor die exposed by the passivation layer 112 is in contact with the protective insulating layer 110.

In some embodiments, the RDL structure 106 is in contact with the passivation layer 112 as shown in FIG. 9A, but the present disclosure is not limit thereto. For example, the passivation layer 112 may not be formed, and the RDL structure 106 may be in contact with the protective insulating layer 110 in some other embodiments. In these embodiments, the protective insulating layer 110 is formed after the formation of the RDL structure 106. Alternatively, a portion of the top surface of the RDL structure 106 may be in contact with the passivation layer 112, and another portion of the top surface of the RDL structure 106 may be in contact with the protective insulating layer 110.

According to some embodiments, in addition to the second surface 101b and the third surface 101c of the semiconductor die, the protective insulating layer 110 further covers the RDL structure 106 and the passivation layer 112 can provide an better protection ability of the semiconductor package structure 50a. Furthermore, the semiconductor die shift for the RDL structure alignment can be reduced or avoided. Therefore, reliability of the semiconductor package structure 50b can be improved.

Figure 9B:
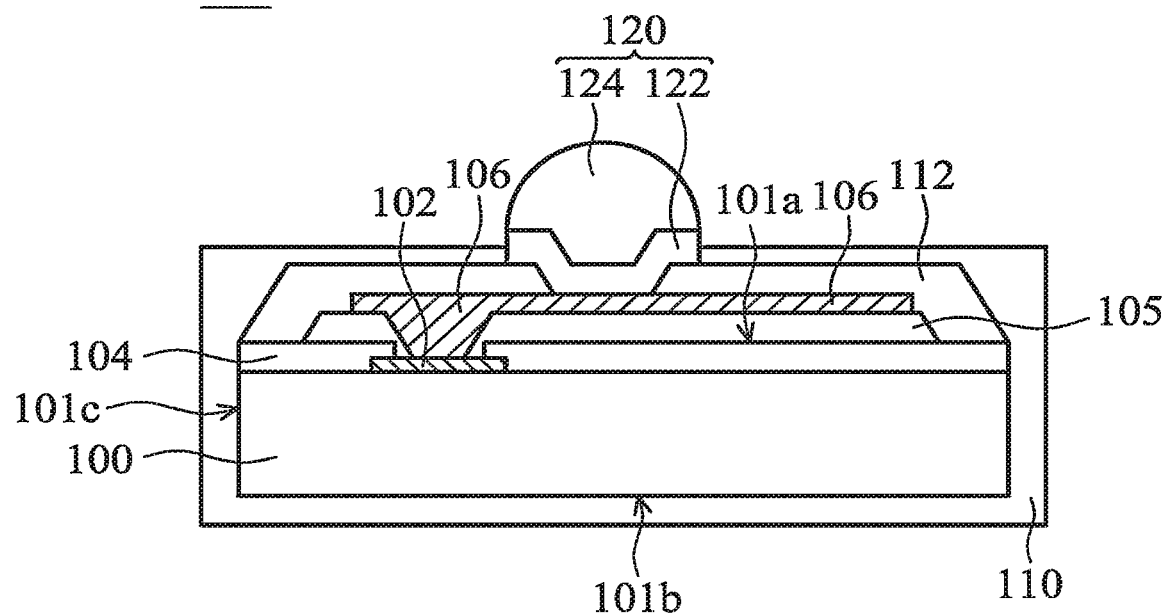
FIG. 9B is a cross-sectional view of an exemplary semiconductor package structure in accordance with some embodiments.

FIG. 9B is a cross-sectional view of an exemplary semiconductor package structure in accordance with some embodiments. Descriptions of elements of the embodiments hereinafter that are the same as or similar to those previously described with reference to FIG. 9A may be omitted for brevity. In some embodiments, the semiconductor package structure 50b is similar to the semiconductor package structure 50a shown in FIG. 9A. Compared to the semiconductor package structure 50a, the semiconductor package structure 50b further includes a passivation layer 105 formed between the first surface 101a of the semiconductor die and the RDL structure 106 and covered by the protective insulating layer 110. In some embodiments, the material and the method used for the passivation layer 105 are the same as or similar to those used for the passivation layer 112 and different from those used for the protective insulating layer 110.

In some embodiments, the semiconductor package structure 50b is formed by a method that is similar to the method described in FIG. 9A, except that an additional passivation layer 105 is formed prior to the formation of the RDL structure 106. Prior to the formation of the RDL structure 106, at least one opening is formed in the passivation layer 105, so that the passivation layer 105 exposes the conductive pad 102 and surrounds the opening formed in the insulating layer 104.

FIGS. 10A to 10E are cross-sectional views of an exemplary method of forming a semiconductor package structure in accordance with some embodiments of the disclosure. Descriptions of elements of the embodiments hereinafter that are the same as or similar to those previously described with reference to FIGS. 1A to 1F, 4A to 4E or 6A to 6E may be omitted for brevity. Compared to the semiconductor package structure 10a-50b as shown in FIGS. 1A-9B, the following embodiment provides a semiconductor package structure with a fan-out structure.

Figure 10A:
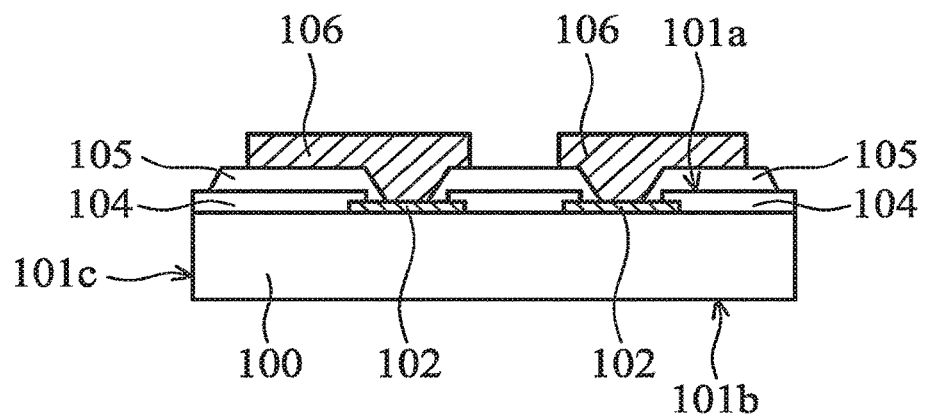
FIGS. 10A to 10E are cross-sectional views of an exemplary method of forming a semiconductor package structure in accordance with some embodiments.
Figure 10B:
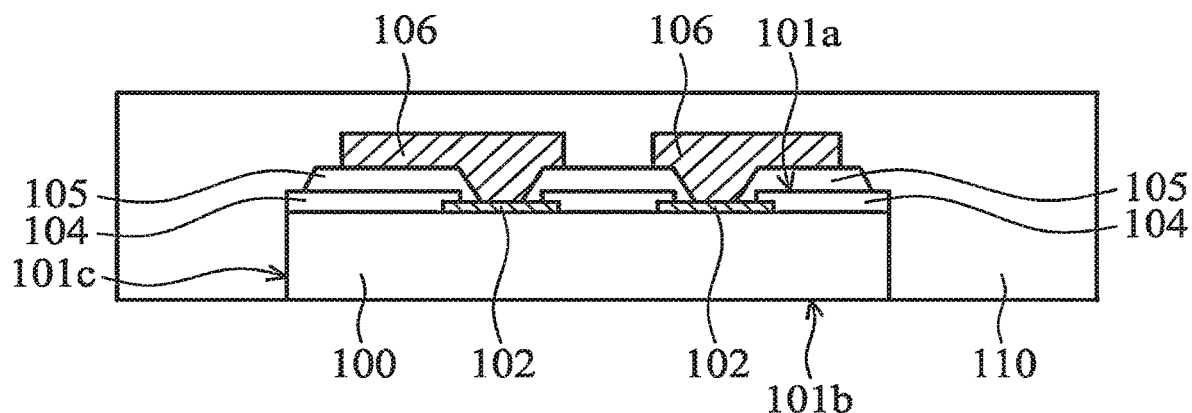

As shown in FIG. 10A, in some embodiments, a substrate 100 is provided. The substrate 100 may be a silicon wafer. For example, the substrate 100 may be a silicon substrate or another semiconductor substrate. In some embodiments, the substrate 100 include integrated circuits (not shown) therein.

In some embodiments, an insulating layer 104 is formed on the substrate 100. The insulating layer 104 may serve as an ILD layer, an IMD layer, a passivation layer or a combination thereof. To simplify the diagram, only a flat layer is depicted herein. In some embodiments, the insulating layer 104 is made of an inorganic material, such as silicon oxide ($SiO_x$), silicon nitride ($SiN_x$), silicon oxynitride (SiON), a combination thereof, or another suitable insulating material.

Moreover, the insulating layer 104 includes one or more conductive pads 102 therein. The conductive pads 102 are adjacent to the upper surface of the substrate 100. The conductive pad 102 may be formed of metal, such as copper, aluminum, or another suitable metal material. Two conductive pads 102 formed on the substrate 100 and exposed from the insulating layer 104 are depicted herein as an example, but the present disclosure is not limit thereto. For example, one or more than two conductive pads 102 may be formed on the substrate 100.

In some embodiments, a conductive layer (not shown), such as a metal layer, is formed on the insulating layer 104 and passing through the insulating layer 104 to electrically couple to the exposed conductive pads 102. Afterwards, the conductive layer is patterned to form a RDL structure 106, so that the RDL structure 106 is electrically coupled to the subsequent formed semiconductor die, as shown in FIG. 10A.

In some embodiments, the substrate 100 is diced to form semiconductor dies with the RDL structure 106 thereon, as shown in FIG. 10A. Each of the formed semiconductor dies may be a SOC integrated circuit die. The SOC integrated circuit die, for example, may include a logic die including a CPU, a GPU, a DRAM controller, or any combination thereof. Each of the semiconductor dies includes a substrate 100, one or more conductive pads 102 formed on the substrate 100, and an insulating layer 104 formed over the substrate 100 and having an opening to expose the conductive pads 102. Moreover, the semiconductor die has a first surface 101a (e.g., an active surface of the semiconductor die), a second surface 101b (e.g., a non-active surface of the semiconductor die) opposite the first surface 101a, and a third surface 101c (e.g., a sidewall surface of the semiconductor die) adjoined between the first surface 101a and the second surface 101b.

In some embodiments, the second surface 101b of each semiconductor die may be mounted onto a carrier substrate (not shown) via an adhesive layer (not shown) using a pick-and-place process. Next, in some embodiments, a protective insulating layer 110 is formed to cover the first surface 101a and the third surface 101c of the semiconductor dies and to surround the RDL structure 106, so that each of the formed semiconductor dies with an RDL structure 106 thereon is encapsulated by the protective insulating layer 110. In some embodiments, the protective insulating layer 110 protects the semiconductor dies from the environment, thereby preventing the semiconductor die in the subsequently formed semiconductor package structure from damage due to, for example, the stress, the chemicals and/or the moisture.

In some embodiments, the protective insulating layer 110 is made of an epoxy molding compound (EMC), an Ajinomoto™ Build-up Film (ABF), or an acrylic-based material. In some embodiments, the protective insulating layer 110 is made of an epoxy molding compound (EMC) and formed by a molding process. The exemplary formation of the protective insulating layer 110 is described above, and will not be repeated again.

After the protective insulating layer 110 is formed, the semiconductor die with the RDL structure 106 encapsulated by the protective insulating layer 110 is de-bonded from the carrier substrate. The exemplary method of de-bonding is described above, and will not be repeated again. As a result, the second surface 101b of each semiconductor die is exposed from the protective insulating layer 110.

Figure 10C:
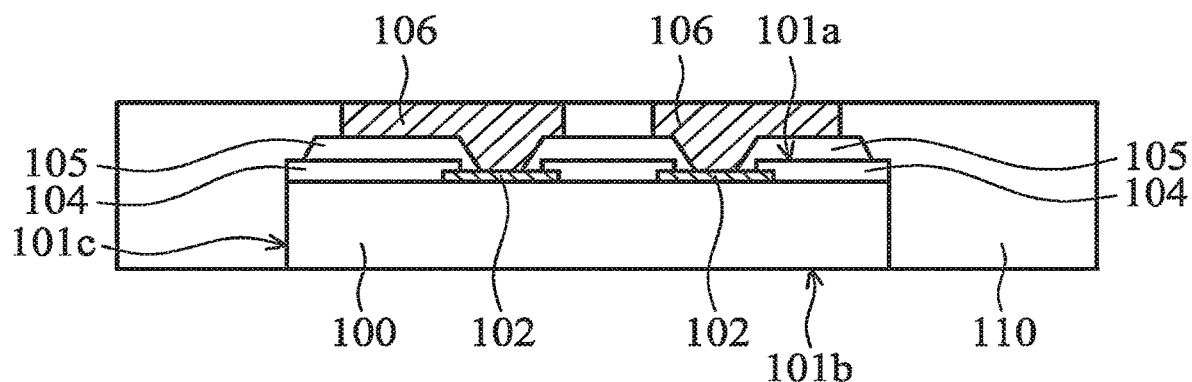

In some embodiments, after the carrier substrate is removed by the de-bonding process, a grinding process is performed on the top surface of the protective insulating layer 110 until the RDL structure 106 is exposed from the protective insulating layer 110, as shown in FIG. 10C. For example, the top surface of the protective insulating layer 110 may be grinded by a CMP process or another suitable grinding process.

Figure 10D:
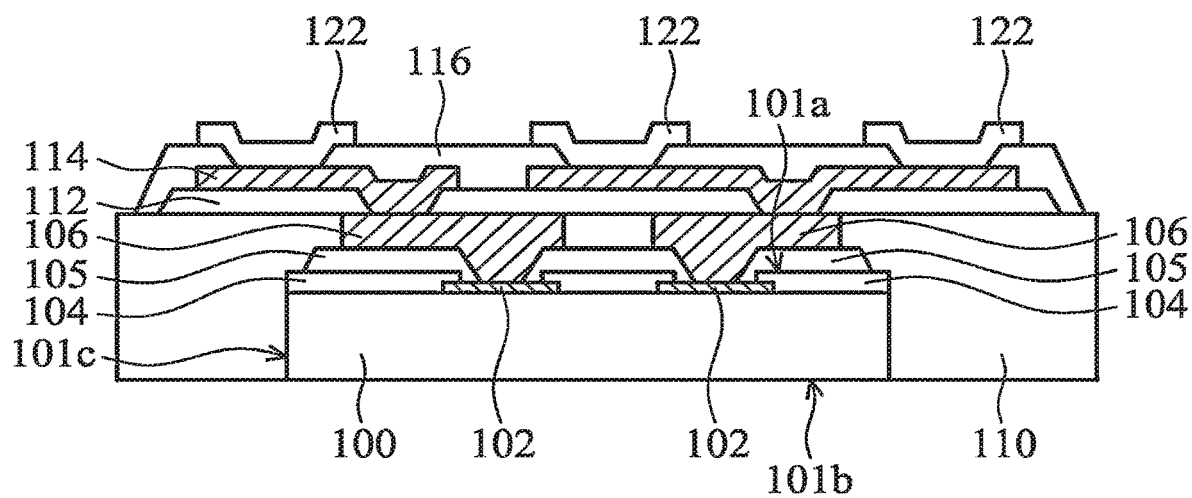

Afterwards, the protective insulating layer 110 and the RDL structure 106 are covered with a passivation layer 112, as shown in FIG. 10D. In some embodiments, the passivation layer 112 is formed on the protective insulating layer 110 and the RDL structure 106 by a coating process or another suitable deposition process. Afterwards, the passivation layer 112 is patterned by lithography or a combination of lithograph and etching to form openings that expose the RDL structure 106. In some embodiments, the passivation layer 112 is made of a material that is different from the material of the protective insulating layer 110. In some embodiments, the passivation layer 112 is made of polyimide or polybenzoxazole (PBO).

After openings are formed in the passivation layer 112, a RDL structure 114 passes through the passivation layer 112 via those openings formed in the passivation layer 112, as shown in FIG. 10D. The formation and the material of the RDL structure 114 may include the formation and the material as described above with respect to the RDL structure 106, and will not be repeated again. In some embodiments, the RDL structure 114 fills into the openings formed in the passivation layer 112, so that each of the RDL structure 114 is electrically coupled to the respective exposed RDL structure 106 under the opening in the passivation layer 112.

As shown in FIG. 10D, the RDL structure 114 extends from the RDL structure 106 to above the protective insulating layer 110, according to some embodiments. In particular, the RDL structure 114 may extend from directly above the first surface 101a of the semiconductor die to directly above the protective insulating layer 110. Accordingly, the RDL structure 114 enables the fan-out connection.

Afterwards, the protective insulating layer 110, the passivation layer 112, and the RDL structure 114 are covered with a patterned passivation layer 116, as shown in FIG. 10D. In some embodiments, the passivation layer 116 is made of a material that is different from the material of the protective insulating layer 110. The formation and the material of the passivation layer 116 may include the formation and the material as described above with respect to the passivation layer 112 or the passivation layer 105, and will not be repeated again. Afterwards, the passivation layer 116 is patterned by lithography or a combination of lithograph and etching to form openings that expose the RDL structure 114.

After openings are formed in the passivation layer 116, an UBM layer 122 passes through the passivation layer 116 via those openings formed in the passivation layer 116, as shown in FIG. 10D. In some embodiments, the UBM layer 122 fills into the openings formed in the passivation layer 116, so that each of the conductive structures 120 is electrically coupled to the respective exposed RDL structure 114 under the opening in the passivation layer 116.

Figure 10E:
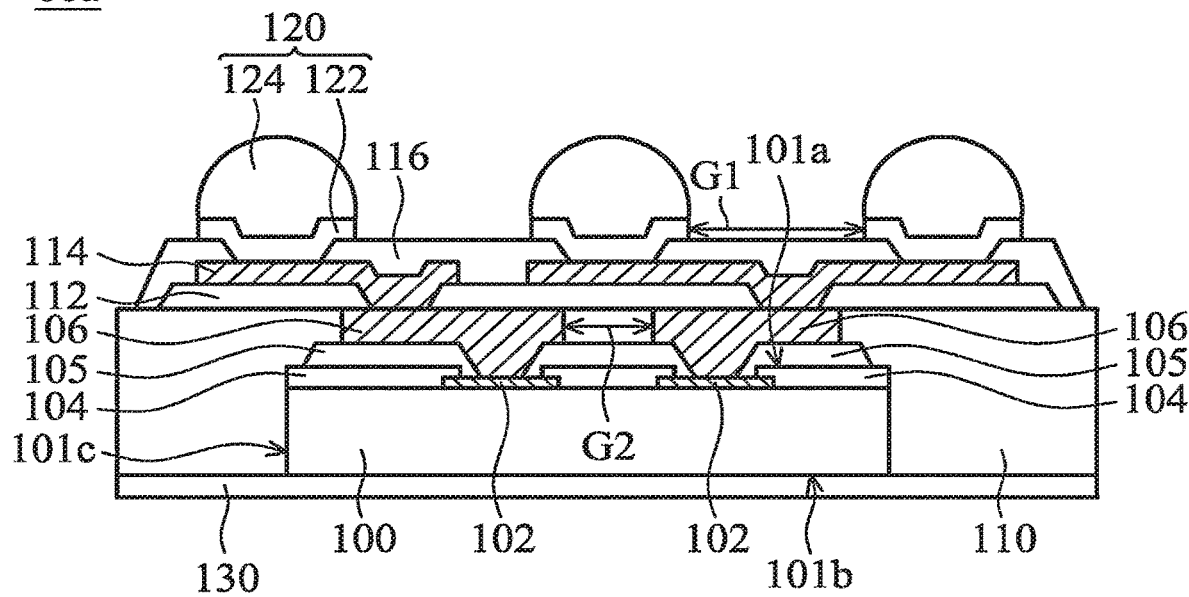

As shown in FIG. 10E, a solder bump 124 is formed on the UBM layer 122, according to some embodiments. In some embodiments, a conductive structure 120 includes the UBM layer 122 and the solder bump 124. In some other embodiments, the conductive structure 120 includes a conductive bump structure such as a copper bump, a conductive pillar structure, a conductive wire structure, or a conductive paste structure. In some embodiments, more than one conductive structures 120 are formed. As shown in FIG. 10E, the gap G1 between the conductive structures 120 may be greater than the gap G2 between the RDL structures 106 to achieve the fan-out structure.

After the conductive structures 120 are formed, an optional protective insulating layer 130 is formed to cover the exposed second surface 101b of the semiconductor dies, as shown in FIG. 10E. The protective insulating layer 130 is sometimes referred to as a DBF that is made of a thermoset material, such as an epoxy resin material. In some other embodiments, the protective insulating layer 130 is made of a material that is the same as the material of the protective insulating layer 110. For example, the protective insulating layer 130 is made of an epoxy molding compound (EMC), an Ajinomoto™ Build-up Film (ABF), or an acrylic-based material.

Figure 10F:
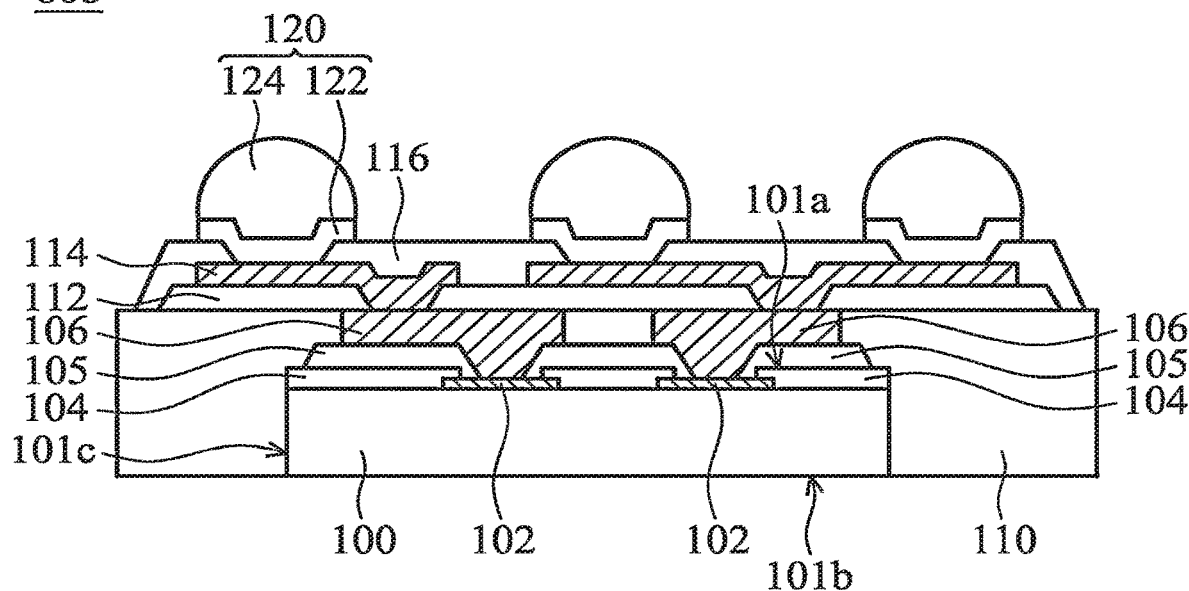
FIG. 10F is a cross-sectional view of an exemplary semiconductor package structure in accordance with some embodiments.

FIG. 10F is a cross-sectional view of an exemplary semiconductor package structure in accordance with some embodiments. Descriptions of elements of the embodiments hereinafter that are the same as or similar to those previously described with reference to FIG. 10E may be omitted for brevity. In some embodiments, the semiconductor package structure 60b is similar to the semiconductor package structure 60a shown in FIG. 10E. Compared to the semiconductor package structure 60a, there is no protective insulating layer 130 formed in the package structure 60b, and hence the second surface 101b of the semiconductor die is exposed to the environment. In some embodiments, the semiconductor package structure 60b is formed by a method that is similar to the method shown in FIGS. 10A to 10E, except that the formation of the protective insulating layer 130, as shown in FIG. 10E, is omitted.

Figure 11A:
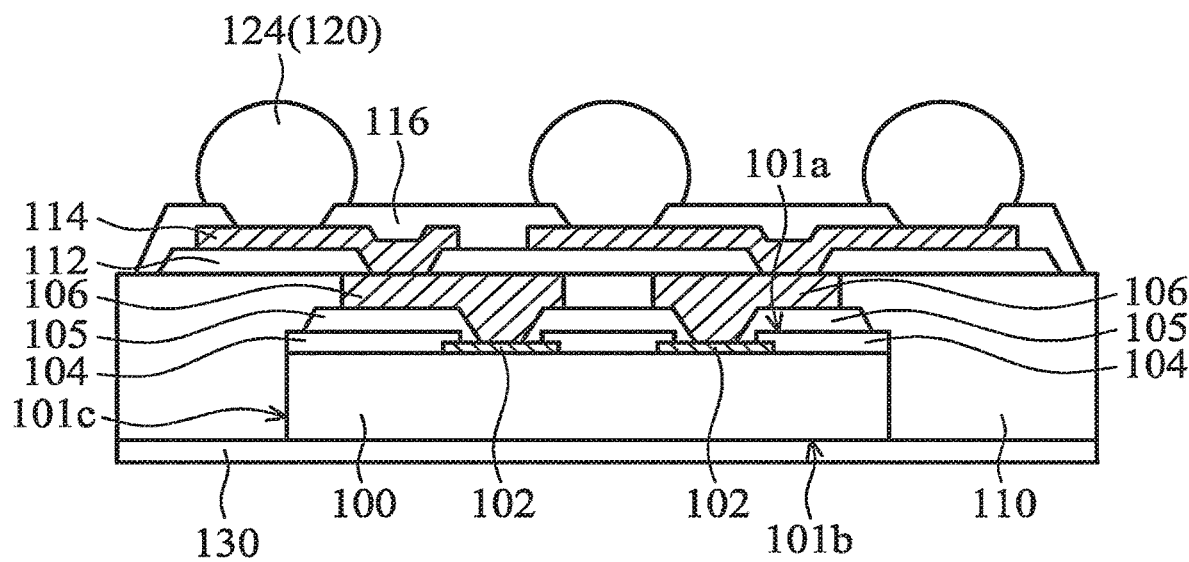
FIG. 11A is a cross-sectional view of an exemplary semiconductor package structure in accordance with some embodiments.

FIG. 11A is a cross-sectional view of an exemplary semiconductor package structure in accordance with some embodiments. Descriptions of elements of the embodiments hereinafter that are the same as or similar to those previously described with reference to FIG. 10E may be omitted for brevity. In some embodiments, the semiconductor package structure 70a is similar to the semiconductor package structure 60a shown in FIG. 10E. Compared to the semiconductor package structure 60a, there is no UBM layer 122 formed in the package structure 70a, and hence the solder bump 124 is formed directly on the passivation layer 116. In some embodiments, the semiconductor package structure 70a is formed by a method that is similar to the method shown in FIGS. 10A to 10E, except that the formation of the UBM layer 122, as shown in FIG. 10E, is omitted.

As shown in FIG. 11A, the solder bump 124 may pass through the passivation layer 116 via openings formed in the passivation layer 116. In some embodiments, the solder bump 124 fills into the openings formed in the passivation layer 116, so that each of the conductive structures 120 is electrically coupled to the respective exposed RDL structure 114 under the opening in the passivation layer 116.

Figure 11B:
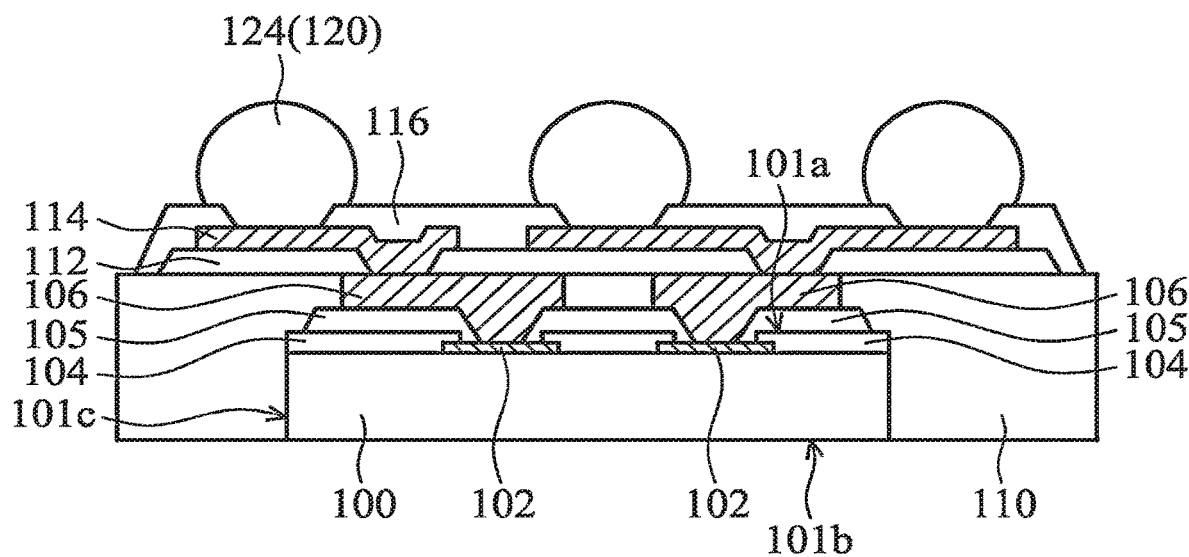
FIG. 11B is a cross-sectional view of an exemplary semiconductor package structure in accordance with some embodiments.

FIG. 11B is a cross-sectional view of an exemplary semiconductor package structure in accordance with some embodiments. Descriptions of elements of the embodiments hereinafter that are the same as or similar to those previously described with reference to FIG. 11A may be omitted for brevity. In some embodiments, the semiconductor package structure 70b is similar to the semiconductor package structure 70a shown in FIG. 11A. Compared to the semiconductor package structure 70a, there is no protective insulating layer 130 formed in the package structure 70b, and hence the second surface 101b of the semiconductor die is exposed to the environment.

Figure 12A:
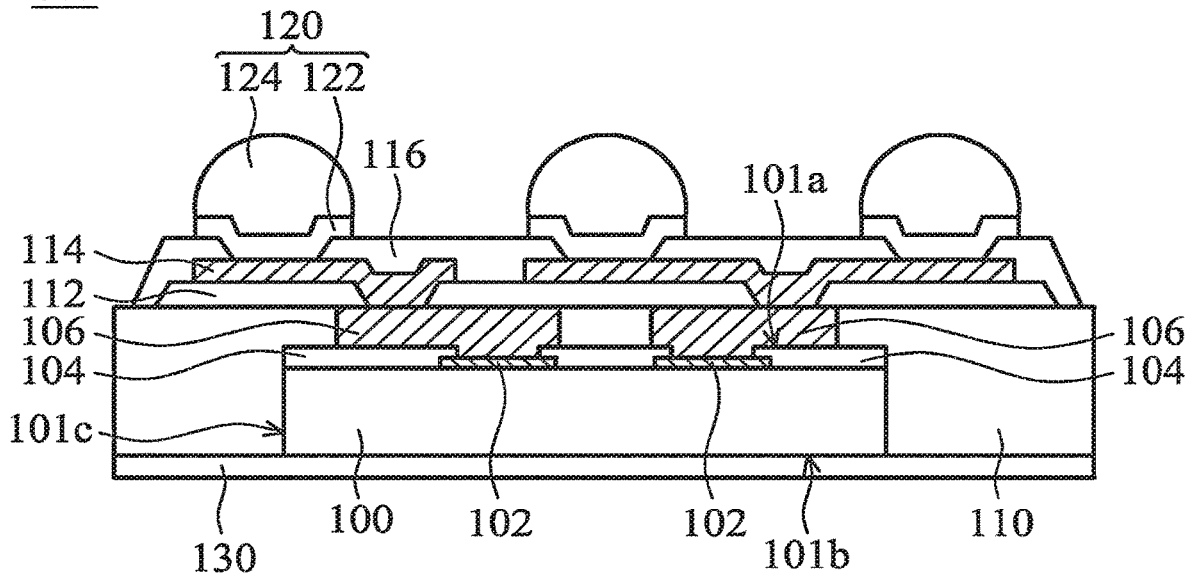
FIG. 12A is a cross-sectional view of an exemplary semiconductor package structure in accordance with some embodiments.

FIG. 12A is a cross-sectional view of an exemplary semiconductor package structure in accordance with some embodiments. Descriptions of elements of the embodiments hereinafter that are the same as or similar to those previously described with reference to FIG. 10E may be omitted for brevity. In some embodiments, the semiconductor package structure 80a is similar to the semiconductor package structure 60a shown in FIG. 10E. Compared to the semiconductor package structure 60a, there is no passivation layer 105 formed in the package structure 80b, and hence the RDL structure 106 is formed directly on the insulating layer 104. In some embodiments, the semiconductor package structure 80a is formed by a method that is similar to the method shown in FIGS. 10A to 10E, except that the formation of the passivation layer 105, as shown in FIG. 10A, is omitted.

Figure 12B:
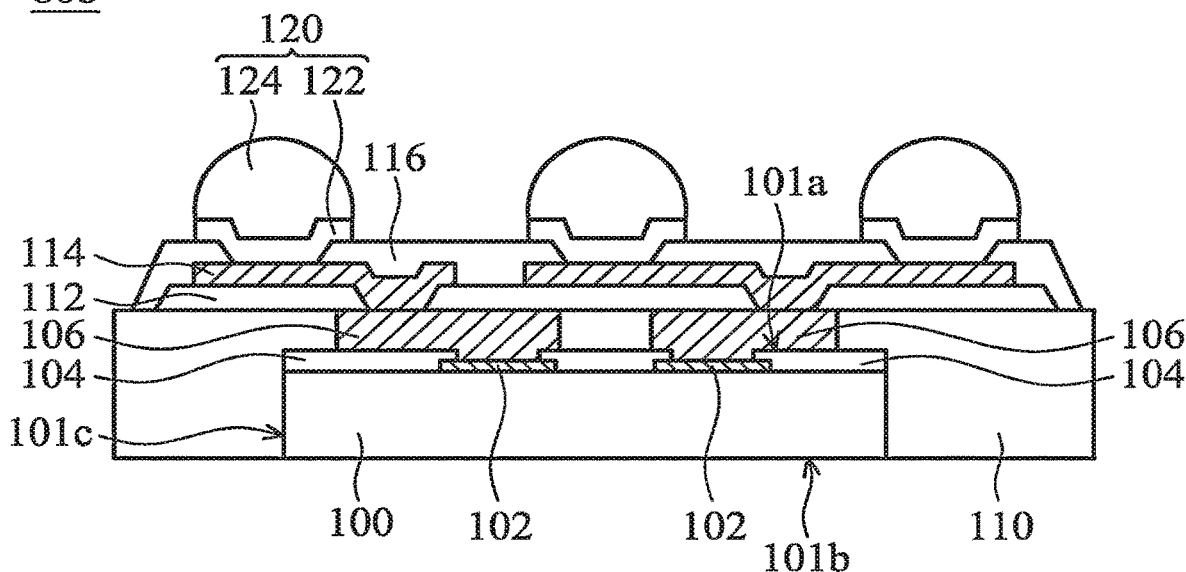
FIG. 12B is a cross-sectional view of an exemplary semiconductor package structure in accordance with some embodiments.

FIG. 12B is a cross-sectional view of an exemplary semiconductor package structure in accordance with some embodiments. Descriptions of elements of the embodiments hereinafter that are the same as or similar to those previously described with reference to FIG. 12A may be omitted for brevity. In some embodiments, the semiconductor package structure 80b is similar to the semiconductor package structure 80a shown in FIG. 12A. Compared to the semiconductor package structure 80a, there is no protective insulating layer 130 formed in the package structure 80b, and hence the second surface 101b of the semiconductor die is exposed to the environment.

Figure 13A:
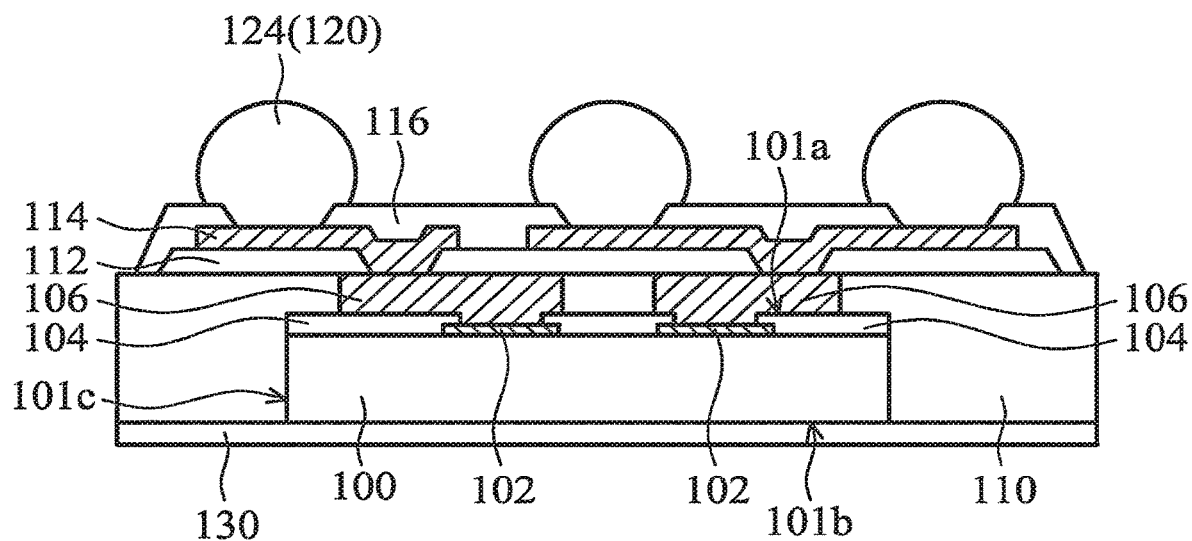
FIG. 13A is a cross-sectional view of an exemplary semiconductor package structure in accordance with some embodiments.

FIG. 13A is a cross-sectional view of an exemplary semiconductor package structure in accordance with some embodiments. Descriptions of elements of the embodiments hereinafter that are the same as or similar to those previously described with reference to FIG. 10E may be omitted for brevity. In some embodiments, the semiconductor package structure 90a is similar to the semiconductor package structure 60a shown in FIG. 10E. Compared to the semiconductor package structure 60a, there is no passivation layer 105 and no UBM layer 122 formed in the package structure 90a, and hence the RDL structure 106 is formed directly on the insulating layer 104 and the solder bump 124 is formed directly on the passivation layer 116. In some embodiments, the semiconductor package structure 80a is formed by a method that is similar to the method shown in FIGS. 10A to 10E, except that the formation of the passivation layer 105 and the UBM layer 122, is omitted.

Figure 13B:
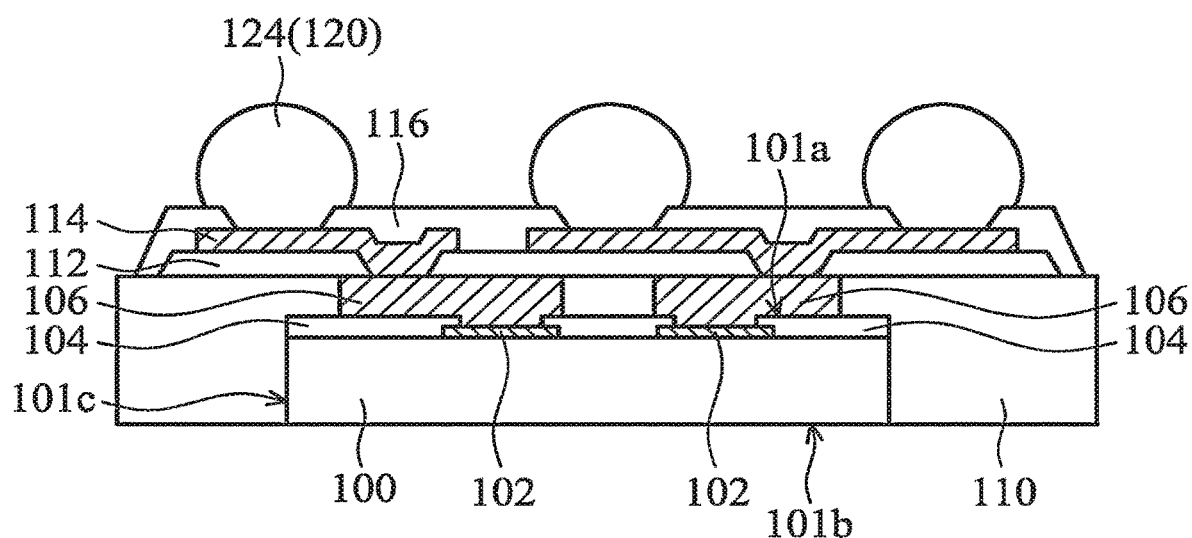
FIG. 13B is a cross-sectional view of an exemplary semiconductor package structure in accordance with some embodiments.

FIG. 13B is a cross-sectional view of an exemplary semiconductor package structure in accordance with some embodiments. Descriptions of elements of the embodiments hereinafter that are the same as or similar to those previously described with reference to FIG. 13A may be omitted for brevity. In some embodiments, the semiconductor package structure 90*b* is similar to the semiconductor package structure 90*a* shown in FIG. 13A. Compared to the semiconductor package structure 90*a*, there is no protective insulating layer 130 formed in the package structure 90*b*, and hence the second surface 101*b* of the semiconductor die is exposed to the environment.

According to the foregoing embodiments, the semiconductor package structure is designed to fabricate a protective structure in the semiconductor package structure to cover or encapsulate the semiconductor die in the semiconductor package structure. The protective structure includes one or more protective insulating layers to protect the semiconductor die from the environment, thereby preventing the semiconductor die in the semiconductor package structure from damage due to, for example, the stress, the chemicals and/or the moisture.

Due to the topside protection of semiconductor die, the reliability of the semiconductor package structure can be maintained during the subsequent thermal process (such as a surface mount technology (SMT) process or a bonding process). Moreover, the RDL structure formed on the semiconductor die is also protected by the protective structure, so as to keep its electrical and thermal performance. In addition, due to the sidewall protection of semiconductor die, the semiconductor die in the semiconductor package structure can be prevented from chipping when the CSP structure is placed in a test socket for performing a test process.

Furthermore, the protective insulating layer covers the RDL structure and the passivation layer, the second surface and the third surface of the semiconductor die can provide a better protection ability of the semiconductor package structure, according to some embodiments. In addition, the semiconductor die shift for the RDL structure alignment can be reduced or avoided. Therefore, reliability of the semiconductor package structure can be improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a semiconductor die having a first surface, a second surface opposite the first surface, and a third surface extending between the first surface and the second surface;
   a first conductive pad disposed on at least a portion of the first surface of the semiconductor die and electrically coupled to the semiconductor die;
   an insulating layer disposed on the first surface of the semiconductor die;
   a first redistribution layer (RDL) structure on the insulating layer, passing through a portion of the insulating layer and electrically coupled to the first conductive pad;
   a first passivation layer covering the first RDL structure;
   a second RDL structure passing through a portion of the first passivation layer and electrically coupled to the first RDL structure;
   a second passivation layer covering the second RDL structure;
   a first conductive structure passing through the second passivation layer and electrically coupled to the second RDL structure;
   a protective insulating layer covering the third surface of the semiconductor die, wherein a top surface of the protective insulating layer is coplanar with a top surface of the first RDL structure; and
   a second conductive structure electrically insulated from the first conductive structure by a portion of the second passivation layer and electrically coupled to a portion of the second RDL structure to which the first conductive structure is electrically coupled.

2. The semiconductor package structure of claim 1, further comprising:
   a third conductive structure electrically insulated from the first conductive structure and the second conductive structure by a portion of the second passivation layer and electrically coupled to the second RDL structure.

3. The semiconductor package structure of claim 2, further comprising:
   a second conductive pad disposed on at least a portion of the first surface of the semiconductor die and electrically coupled to the semiconductor die;
   wherein the insulating layer electrically insulates the first conductive pad from the second conductive pad;
   wherein a portion of the first RDL structure, electrically insulated from a portion of the first RDL structure electrically coupled to the first conductive pad, is electrically coupled to the second conductive pad;
   a portion of the second RDL structure, electrically insulated from a portion of the second RDL structure electrically coupled to the portion of the first RDL structure which is electrically coupled to the first conductive pad, passes through a portion of the first passivation layer and is electrically coupled to the portion of the first RDL structure which is electrically coupled to the second conductive pad; and
   wherein the third conductive structure is electrically coupled to the portion of the second RDL structure electrically connected to the portion of the first RDL structure which is electrically connected to the second conductive pad.

4. The semiconductor package structure of claim 1, wherein the first conductive structure is in direct physical contact with the second RDL structure.

5. The semiconductor package structure of claim 1, wherein the first conductive structure comprises a solder bump.

6. The semiconductor package structure of claim 1, wherein the first conductive structure comprises a conductive pillar structure.

7. The semiconductor package structure of claim 1, wherein the first conductive structure comprises a conductive bump structure.

8. The semiconductor package structure of claim 1, wherein the first conductive structure comprises a conductive paste structure.

9. The semiconductor package structure of claim 1, wherein the protective insulating layer covers the second surface of the semiconductor die.

10. The semiconductor package structure of claim 1, wherein:
    the first passivation layer and the second passivation layer comprise the same material; and
    the protective insulating layer comprises a material different from that of the first passivation layer and the second passivation layer.

11. The semiconductor package structure of claim 10, wherein the first passivation layer and the second passivation layer comprise polyimide or polybenzoxazole.

12. The semiconductor package structure of claim 10, wherein the protective insulating layer comprises an epoxy molding compound or an acrylic-based material.

* * * * *